(12) United States Patent
Shin et al.

(10) Patent No.: US 12,034,060 B2
(45) Date of Patent: *Jul. 9, 2024

(54) SEMICONDUCTOR DEVICE HAVING A RING-SHAPED PROTECTION SPACER ABOVE A CONTACT PAD AND ENCLOSING A SOURCE/DRAIN CONTACT PLUG

(71) Applicant: SAMSUNG ELECTRONICS CO., LTD., Suwon-si (KR)

(72) Inventors: Hongsik Shin, Seoul (KR); Hyunjoon Roh, Hwaseong-si (KR); Heungsik Park, Seoul (KR); Sughyun Sung, Yongin-si (KR); Dohaing Lee, Seoul (KR); Wonhyuk Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

This patent is subject to a terminal disclaimer.

(21) Appl. No.: 17/837,158

(22) Filed: Jun. 10, 2022

(65) Prior Publication Data

US 2022/0376080 A1 Nov. 24, 2022

Related U.S. Application Data

(63) Continuation of application No. 16/841,889, filed on Apr. 7, 2020, now Pat. No. 11,362,196.

(30) Foreign Application Priority Data

Aug. 23, 2019 (KR) .......................... 10-2019-0103975

(51) Int. Cl.
*H01L 29/06* (2006.01)
*H01L 21/306* (2006.01)
(Continued)

(52) U.S. Cl.
CPC .... *H01L 29/6656* (2013.01); *H01L 21/30604* (2013.01); *H01L 21/31144* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 7,397,131 B2 | 7/2008 | Kim et al. |
| 9,312,182 B2 | 4/2016 | Xie et al. |

(Continued)

FOREIGN PATENT DOCUMENTS

| KR | 10-1688702 B1 | 12/2016 |
| KR | 10-2017-0095836 A | 8/2017 |

(Continued)

*Primary Examiner* — Younes Boulghassoul
(74) *Attorney, Agent, or Firm* — Muir Patent Law, PLLC

(57) ABSTRACT

A semiconductor device includes a gate pattern crossing over a substrate, the gate pattern including a gate insulating layer, a gate electrode, and a gate capping pattern sequentially stacked on the substrate, a gate spacer covering a sidewall of the gate pattern, a source/drain pattern on the substrate, the source/drain pattern being adjacent to the sidewall of the gate pattern, a contact pad on the source/drain pattern, a top surface of the contact pad being lower than a top surface of the gate electrode, a source/drain contact plug on the contact pad, and a protection spacer between the gate spacer and the source/drain contact plug, the protection spacer having a ring shape enclosing the source/drain contact plug.

19 Claims, 29 Drawing Sheets

(51) Int. Cl.
  *H01L 21/311*   (2006.01)
  *H01L 21/768*   (2006.01)
  *H01L 21/8234*  (2006.01)
  *H01L 27/088*   (2006.01)
  *H01L 29/417*   (2006.01)
  *H01L 29/423*   (2006.01)
  *H01L 29/66*    (2006.01)
  *H01L 29/78*    (2006.01)
  *H01L 29/786*   (2006.01)

(52) U.S. Cl.
  CPC .. *H01L 21/76816* (2013.01); *H01L 21/76831* (2013.01); *H01L 21/76897* (2013.01); *H01L 21/823418* (2013.01); *H01L 21/823431* (2013.01); *H01L 21/823468* (2013.01); *H01L 21/823475* (2013.01); *H01L 27/0886* (2013.01); *H01L 29/0653* (2013.01); *H01L 29/41791* (2013.01); *H01L 29/4232* (2013.01); *H01L 29/42392* (2013.01); *H01L 29/66553* (2013.01); *H01L 29/785* (2013.01); *H01L 29/78696* (2013.01); *H01L 2029/7858* (2013.01)

(58) Field of Classification Search
  CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/41725; H01L 29/41733; H01L 29/4175; H01L 29/41766; H01L 29/41775; H01L 29/41783; H01L 21/823475; H01L 21/823871; H01L 21/76897; H01L 21/76804; H01L 21/76805; H01L 21/76816; H01L 21/76877; H01L 23/5226; H01L 23/5283; H01L 23/5286; H01L 23/528; H01L 23/5384; H01L 23/5386; H01L 21/823468; H01L 21/823864; H01L 29/6656; H01L 29/6653; H01L 29/66553; H01L 29/4983; H01L 21/76829; H01L 21/76831; H01L 21/76832; H01L 21/76834; H01L 2221/1057; H01L 2221/1063
  See application file for complete search history.

(56) References Cited

U.S. PATENT DOCUMENTS

| | | | |
|---|---|---|---|
| 10,038,065 B2 | 7/2018 | Xie et al. | |
| 10,043,879 B1 | 8/2018 | Kim et al. | |
| 10,083,863 B1 | 9/2018 | Hsieh et al. | |
| 10,163,703 B2 | 12/2018 | Wang et al. | |
| 10,164,032 B2 | 12/2018 | Lee et al. | |
| 10,170,583 B2 | 1/2019 | Cheng et al. | |
| 10,453,749 B2 | 10/2019 | Tapily et al. | |
| 2011/0156107 A1 | 6/2011 | Bohr et al. | |
| 2015/0187945 A1 | 7/2015 | Kamineni et al. | |
| 2016/0071799 A1 | 3/2016 | Hsieh et al. | |
| 2016/0308016 A1 | 10/2016 | Choi et al. | |
| 2016/0343825 A1* | 11/2016 | Bae | H01L 21/76855 |
| 2016/0351570 A1* | 12/2016 | Park | H01L 21/3065 |
| 2017/0170316 A1 | 6/2017 | Chang et al. | |
| 2017/0170322 A1 | 6/2017 | Chang et al. | |
| 2017/0222014 A1* | 8/2017 | Tak | H01L 21/76895 |
| 2017/0263553 A1 | 9/2017 | Schenker et al. | |
| 2018/0174904 A1 | 6/2018 | Hsieh et al. | |
| 2018/0190809 A1 | 7/2018 | Huang et al. | |
| 2018/0197970 A1 | 7/2018 | Pan et al. | |
| 2018/0286861 A1 | 10/2018 | Choi et al. | |
| 2018/0315854 A1* | 11/2018 | Liaw | H01L 21/823412 |
| 2019/0074362 A1 | 3/2019 | Lee et al. | |
| 2019/0131171 A1* | 5/2019 | Gwak | H01L 29/6656 |
| 2019/0164957 A1* | 5/2019 | Meng | H10B 12/056 |
| 2020/0135871 A1 | 4/2020 | Tsai et al. | |
| 2021/0035861 A1 | 2/2021 | Chen et al. | |

FOREIGN PATENT DOCUMENTS

| | | |
|---|---|---|
| KR | 10-2017-0142849 A | 12/2017 |
| KR | 10-2018-0093833 A | 8/2018 |
| KR | 10-2018-0103402 A | 9/2018 |

* cited by examiner

SEMICONDUCTOR DEVICE HAVING A RING-SHAPED PROTECTION SPACER ABOVE A CONTACT PAD AND ENCLOSING A SOURCE/DRAIN CONTACT PLUG

CROSS-REFERENCE TO RELATED APPLICATION

This is a continuation of U.S. patent application Ser. No. 16/841,889 filed Apr. 7, 2020, which is incorporated by reference herein in its entirety.

Korean Patent Application No. 10-2019-0103975, filed on Aug. 23, 2019, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same.

2. Description of the Related Art

Due to their small-size, multifunctionality, and/or low-cost characteristics, semiconductor devices are esteemed as important elements in the electronic industry. The semiconductor devices are classified into semiconductor memory devices for storing data, semiconductor logic devices for processing data, and hybrid semiconductor devices including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are increased.

SUMMARY

According to an embodiment, a semiconductor device may include a gate pattern crossing a substrate and including a gate insulating layer, a gate electrode, and a gate capping pattern sequentially stacked on the substrate, a gate spacer covering a sidewall of the gate pattern, a source/drain pattern disposed on the substrate and beside the gate pattern, a contact pad disposed on the source/drain pattern to have a top surface lower than a top surface of the gate electrode, a source/drain contact plug on the contact pad, and a protection spacer interposed between the gate spacer and the source/drain contact plug to have a ring shape enclosing the source/drain contact plug.

According to an embodiment, a semiconductor device may include an active fin protruding from a substrate and extending in a first direction, a gate pattern crossing the active fin and including a gate insulating layer, a gate electrode, and a gate capping pattern sequentially stacked on the substrate, a gate spacer covering a sidewall of the gate pattern, a source/drain pattern disposed on the active fin and beside the gate pattern, a contact pad disposed on the source/drain pattern to have a top surface lower than a top surface of the gate electrode, a source/drain contact plug on the contact pad, and a protection spacer interposed between the gate spacer and the source/drain contact plug, the protection spacer having a ring shape enclosing the source/drain contact plug and having a width greater than the gate spacer.

According to an embodiment, a method of fabricating a semiconductor device may include forming gate patterns, gate spacers, a source/drain pattern, and an interlayered insulating layer on a substrate, the gate patterns crossing the substrate and being adjacent to each other, the gate spacers covering sidewalls of the gate patterns, the source/drain pattern being disposed between adjacent ones of the gate spacers, and the interlayered insulating layer being formed to cover the gate patterns, the gate spacers, and the source/drain pattern, each of the gate patterns including a gate insulating layer, a gate electrode, and a gate capping pattern sequentially stacked, performing an anisotropic etching process on the interlayered insulating layer to form a first hole exposing the source/drain pattern, performing an isotropic etching process on the interlayered insulating layer to enlarge a width of the first hole and to expose sidewalls of the gate spacers, forming a contact pad to be in contact with the source/drain pattern in the first hole, forming a protection spacer in the first hole to cover the sidewalls of adjacent ones of the gate spacers, to expose a top surface of the contact pad, and to have a ring shape when viewed in a plan view, etching the gate capping pattern of at least one of the gate patterns to form a second hole exposing the gate electrode, and forming a source/drain contact plug, which is in contact with the contact pad, in the first hole and a gate contact plug, which is in contact with the gate electrode, in the second hole.

BRIEF DESCRIPTION OF THE DRAWINGS

Features will become apparent to those of skill in the art by describing in detail exemplary embodiments with reference to the attached drawings, in which:

FIGS. 2A to 8A illustrate plan views of stages in a process of fabricating a semiconductor device having the planar structure shown in FIG. 1A.

FIGS. 2B to 8B illustrate sectional views taken along lines A-A', B-B', and C-C' of FIGS. 2A to 8A, respectively.

FIGS. 15 and 16 illustrate plan views, each of which illustrates a semiconductor device according to an embodiment of.

DETAILED DESCRIPTION

Example embodiments will now be described more fully with reference to the accompanying drawings, in which example embodiments are shown.

Figure 1A:
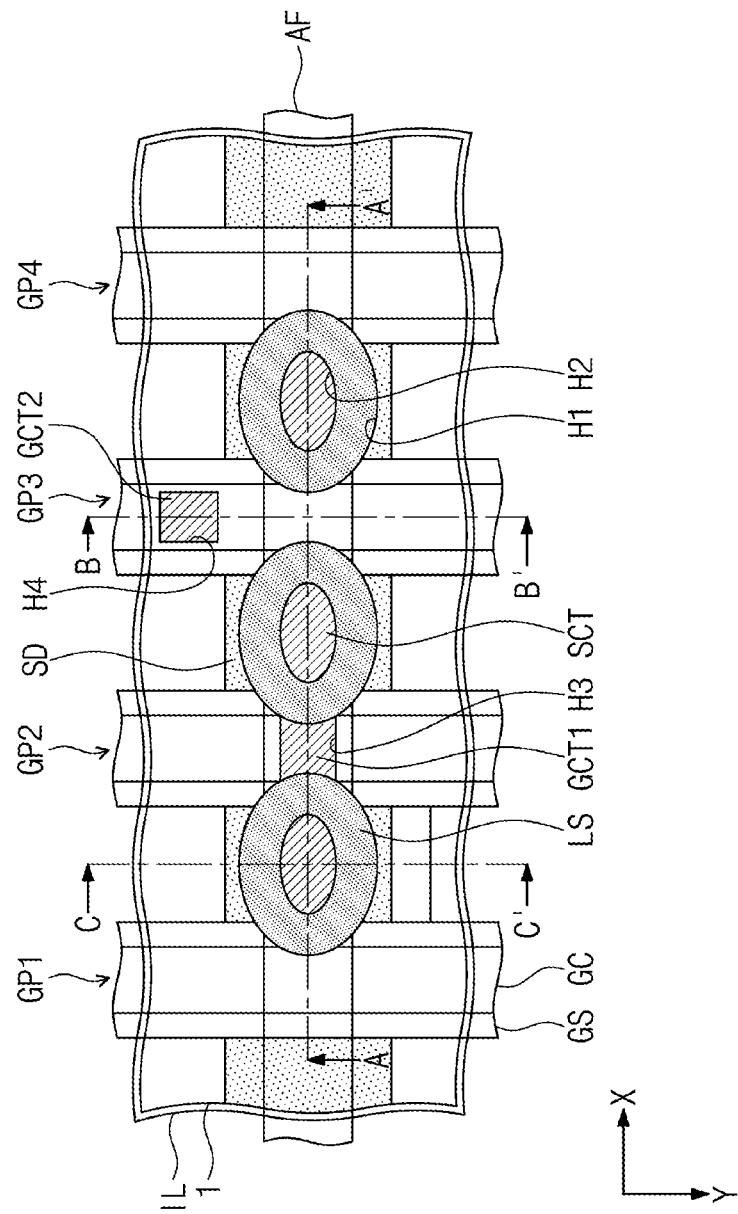
FIG. 1A illustrates a plan view of a semiconductor device according to an embodiment.
Figure 1B:
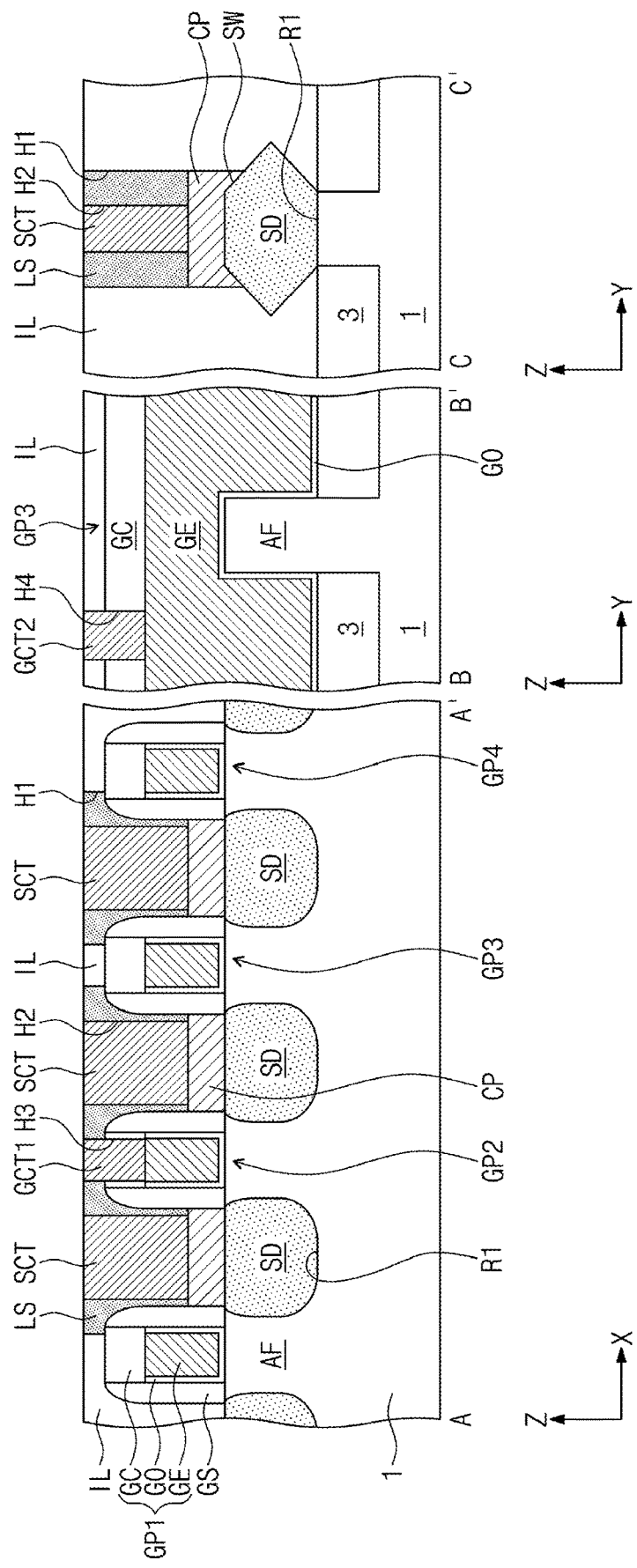
FIG. 1B illustrates a sectional view of a semiconductor device according to an embodiment, taken along lines A-A', B-B', and C-C' of FIG. 1A.

FIG. 1A is a plan view illustrating a semiconductor device according to an embodiment. FIG. 1B is a sectional view along lines A-A', B-B', and C-C' of FIG. 1A, according to an embodiment. The semiconductor device of FIG. 1B may correspond to an example of a FinFET device.

Referring to FIGS. 1A and 1B, an active fin AF may protrude from a substrate 1.

A device isolation layer 3 may be disposed on portions of the substrate 1, which are located beside the active fin AF, e.g., the device isolation layer 3 may be adjacent to the active fin AF along a second direction Y. The active fin AF may have a top surface and an upper side, which are located at a higher level than a top surface of the device isolation layer 3, e.g., along a third direction Z. The substrate 1 may be a single crystalline silicon wafer or a silicon-on-insulator (SOI) wafer. The device isolation layer 3 may be formed of or include at least one of, e.g., silicon oxide, silicon nitride, or silicon oxynitride and may have a single- or multi-layered structure. The active fin AF may be a bar- or line-shaped pattern elongated in a first direction X.

Each of gate patterns GP1, GP2, GP3, and GP4 may be provided to cross over the active fin AF in the second direction Y crossing the first direction X. The gate patterns GP1, GP2, GP3, and GP4 may be spaced apart from each other in the first direction X. Each of the gate patterns GP1, GP2, GP3, and GP4 may include a gate insulating layer GO, a gate electrode GE, and a gate capping pattern GC, which are sequentially stacked on the substrate 1.

The gate insulating layer GO may include at least one of, e.g., silicon oxide or high-k dielectric materials whose dielectric constants are higher than that of silicon oxide. For example, the high-k dielectric materials may include metal oxides (e.g., aluminum oxide). The gate electrode GE may be formed of or include at least one of metallic materials (e.g., tungsten, copper, and aluminum). A work function layer, a diffusion barrier layer, or the like may be interposed between the gate electrode GE and the gate insulating layer GO. The diffusion barrier layer may include a metal nitride layer (e.g., a titanium nitride layer). The gate capping pattern GC may be formed of or include, e.g., silicon nitride.

Gate spacers GS may be provided to cover sidewalls of the gate patterns GP1, GP2, GP3, and GP4, respectively. The gate spacer GS may include, e.g., a silicon nitride layer or a double or triple layer including a silicon nitride layer and a silicon oxide layer. The gate insulating layer GO may be extended into a region between the gate electrode GE and the gate spacer GS and may be in contact with the gate capping pattern GC.

A recessed region R1 may be formed in the active fin AF and beside the gate spacer GS, e.g., the recessed region R1 may be formed within the active fin AF between adjacent ones of the gate patterns GP1, GP2, GP3, and GP4. A source/drain pattern SD may be provided in the recessed region R1. The source/drain pattern SD may be an epitaxial layer, which is formed of the same material as the substrate 1. For example, the source/drain pattern SD may be a silicon epitaxial layer. The source/drain pattern SD may further include a material different from the substrate 1. For example, the source/drain pattern SD may be a silicon germanium epitaxial layer. The source/drain pattern SD may be doped with n-type or p-type impurities. For example, the source/drain pattern SD may be doped with phosphorus or boron. The gate patterns GP1, GP2, GP3, and GP4, the spacer GS, and the source/drain pattern SD may be covered with an interlayered insulating layer IL. The interlayered insulating layer IL may be formed of or include at least one of, e.g., silicon oxide, silicon nitride, silicon oxynitride, or porous insulating materials and may have a single- or multi-layered structure.

A first hole H1 may be formed in the interlayered insulating layer IL to overlap, e.g., expose, the source/drain pattern SD. For example, as illustrated in FIG. 1A, the first hole H1 may be positioned to overlap a portion of the active fin AF between adjacent ones of the gate patterns GP1, GP2, GP3, and GP4. For example, as shown in the section A-A' of FIG. 1B, the sidewall of the gate spacer GS may be overlapped, e.g., exposed, through the first hole H1. For example, as further shown in the section A-A' of FIG. 1B, a topmost width of the first hole H1 along the first direction X (i.e., in a region above the gate patterns GP1, GP2, GP3, and GP4) may be larger than a width of the source/drain pattern SD along the first direction X.

A contact pad CP may be disposed in the first hole H1 and may be in contact with the source/drain pattern SD. As shown in the section A-A' of FIG. 1B, a sidewall of the contact pad CP may be in contact with the sidewall of the gate spacer GS, e.g., along the first direction X. As shown in section C-C' of FIG. 1B, the sidewall of the contact pad CP may be in contact with an inner sidewall of the first hole H1, e.g., along the second direction Y. For example, referring to FIGS. 1A-1B, the contact pad CP may partially fill the first hole H1 immediately above the source/drain pattern SD, so sidewalls of the contact pad CP spaced apart from each other along the first direction X may be in direct contact with facing gate spacers GS of adjacent gate patterns, and sidewalls of the contact pad CP spaced apart from each other along the second direction Y may be in direct contact with facing inner sidewalls of a same first hole H1, i.e., with facing sidewalls of the interlayered insulating layer IL. The contact pad CP may be formed of or include a metal-semiconductor material (e.g., cobalt silicide), a diffusion barrier material (e.g., a titanium nitride), or metallic materials (e.g., tungsten and aluminum.

Upper sides SW of the source/drain pattern SD may be inclined at an angle, e.g., sloping downward from a topmost surface of the source/drain pattern SD, and a lower portion of the contact pad CP may be extended to be in contact with the inclined upper sides SW of the source/drain pattern SD. For example, as illustrated in section C-C' of FIG. 1B, a bottom of the contact pad CP may be conformal along the topmost surface of the source/drain pattern SD and at least partially along the, e.g., downwardly, inclined upper sides SW of the source/drain pattern SD.

On the contact pad CP, the inner sidewall of the first hole H1 may be covered with a protection spacer LS, as shown in section C-C' of FIG. 1B. For example, as illustrated in sections A-A' and B-B' of FIG. 1B, the protection spacer LS may extend, e.g., continuously, along an, e.g., entire, inner sidewall of the first hole H1 to contact a top surface of the contact pad CP. An outer sidewall of the protection spacer LS, e.g., a sidewall contacting the interlayered insulating layer IL, may be aligned, e.g., collinear, with the sidewall of the contact pad CP that contacts the interlayered insulating layer IL. As shown in section A-A' of FIG. 1B, the protection spacer LS may be in contact with the sidewall of the gate spacer GS.

The protection spacer LS may have a closed loop shape, when viewed in a plan view (e.g., shaded gray closed loops in FIG. 1A). In the present embodiment, the protection spacer LS may have an elliptical ring shape, when viewed in the plan view. The protection spacer LS may overlap with the gate spacer GS, e.g., one elliptically shaped protection spacer LS in a single first hole H1 may overlap two facing gate spacers GS of adjacent gate patterns, when viewed in a plan view (FIG. 1A). A width of the protection spacer LS may be greater than a width of the gate spacer GS, e.g., a top portion of one elliptically shaped protection spacer LS in a single first hole H1 may extend beyond the two facing gate spacer GS of adjacent gate patterns to contact with a portion of a top surface of the gate capping pattern GC (in a plan view of FIG. 1A). For example, as illustrated in FIG. 1B, the width of the protection spacer LS, e.g., measured along the first direction X above the gate pattern, may be greater than the width of the gate spacer GS, e.g., measured along the first direction X between facing sidewalls of adjacent gate patterns.

In an embodiment, the protection spacer LS may be formed of or include a low-k dielectric material, whose dielectric constant is lower than that of the gate spacer GS. For example, the gate spacer GS may be formed of or include silicon oxycarbide (SiOC). The protection spacer LS may have a shape protruding above the gate patterns GP1, GP2, GP3, and GP4, e.g., to at least partially overlap a top surface of the gate capping pattern GC. A top surface of the protection spacer LS may be coplanar with a top surface of the interlayered insulating layer IL. Adjacent ones of the protection spacers LS may be spaced apart from each other along the first direction X, and a portion of the interlayered insulating layer IL may be positioned between adjacent ones of the protection spacers LS.

A second hole H2, which is defined by the inner sidewall of the protection spacer LS, may be disposed in the first hole H1, e.g., the first and second holes H1 and H2 may be concentric. The second hole H2 may expose a portion of a top surface of the contact pad CP, which is not covered with the protection spacer LS. A source/drain contact plug SCT may be disposed in the second hole H2, e.g., the source/drain contact plug SCT may completely fill the second hole H2. The protection spacer LS may have a ring shape, e.g., an elliptical ring shape, enclosing, e.g., completely surrounding, the source/drain contact plug SCT, e.g., in the plan view (FIG. 1A), and a tubular cylindrical shape surrounding, e.g., an entire, sidewall of the source/drain contact plug SCT (FIG. 1B). Due to the protection spacer LS, the source/drain contact plug SCT may have a width that is smaller than that of the contact pad CP, e.g., along each of the first and second directions X and Y.

A first gate contact plug GCT1 may be disposed between adjacent ones of the protection spacers LS and on the second gate pattern GP2. The first gate contact plug GCT1 may be provided to penetrate the gate capping pattern GC of the second gate pattern GP2 and to be in contact with the gate electrode GE. The first gate contact plug GCT1 may be disposed in a third hole H3. An inner sidewall of the third hole H3 may be composed of a sidewall of the gate capping pattern GC and a sidewall of the interlayered insulating layer IL. The first gate contact plug GCT1 may be in contact with the protection spacers LS.

A second gate contact plug GCT2 may be disposed on the third gate pattern GP3. The second gate contact plug GCT2 may be provided to penetrate the gate capping pattern GC of the third gate pattern GP3 and to be in contact with the gate electrode GE. As shown in section B-B' of FIG. 1B, the second gate contact plug GCT2 may be vertically overlapped with the device isolation layer 3. The second gate contact plug GCT2 may be disposed in a fourth hole H4. An inner sidewall of the fourth hole H4 may be composed of the sidewall of the gate capping pattern GC and the sidewall of the interlayered insulating layer IL. The second gate contact plug GCT2 may be spaced apart from the protection spacers LS.

Figure 1C:
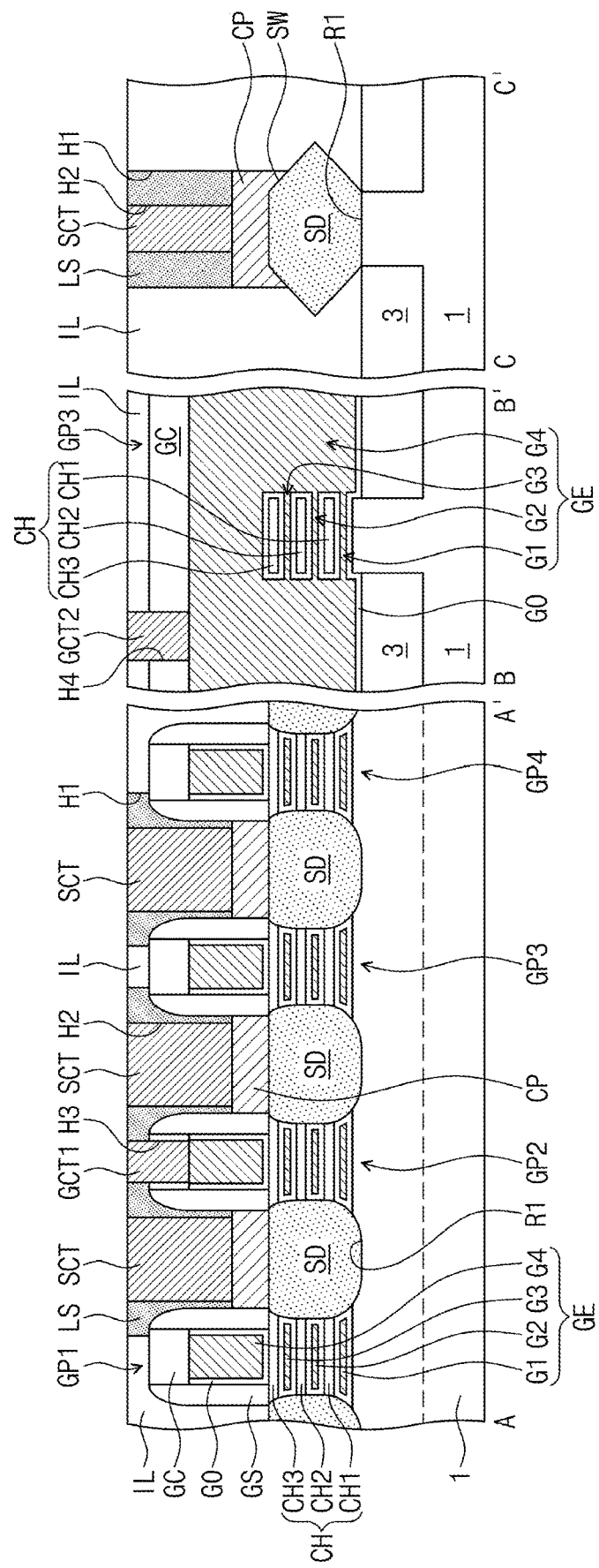
FIG. 1C illustrates a sectional view of a semiconductor device according to an embodiment, taken along the lines A-A', B-B', and C-C' of FIG. 1A.

FIG. 1C is a sectional view illustrating a semiconductor device according to an embodiment, taken along the lines A-A', B-B', and C-C' of FIG. 1A. The semiconductor device of FIG. 1C may correspond to an example of a multi-bridge channel field effect transistor (MBCFET®) device.

Referring to FIG. 1C, a channel pattern CH may be disposed on the active fin AF to be spaced apart from the active fin AF. The channel pattern CH may include first to third semiconductor patterns CH1, CH2, and CH3 stacked on the active fin AF. The first to third semiconductor patterns CH1, CH2, and CH3 may be spaced apart from each other. In an embodiment, the first to third semiconductor patterns CH1, CH2, and CH3 may include, e.g., silicon. The gate electrode GE may cover top and side surfaces of the channel pattern CH. A width of the second semiconductor pattern CH2 may be different from a width of the third semiconductor pattern CH3.

The gate electrode GE may include first to fourth gate portions G1, G2, G3, and G4, which are connected to form a single object. The first gate portion G1 may be positioned between the active fin AF and the first semiconductor pattern CH1. The second gate portion G2 may be positioned between the first semiconductor pattern CH1 and the second semiconductor pattern CH2. The third gate portion G3 may be positioned between the second semiconductor pattern CH2 and the third semiconductor pattern CH3. The gate insulating layer GO may be interposed between the gate electrode GE and the channel pattern CH and between the gate electrode GE and the active fin AF. The source/drain pattern SD may be extended to a region below the gate spacer GS to be in contact with a sidewall of the channel pattern CH. A width of the source/drain pattern may be greater than a width of the contact pad CP. Except for the above features, the semiconductor device according to the present embodiment may be configured to have substantially the same features as those of the semiconductor device described with reference to FIG. 1B.

Figure 1D:
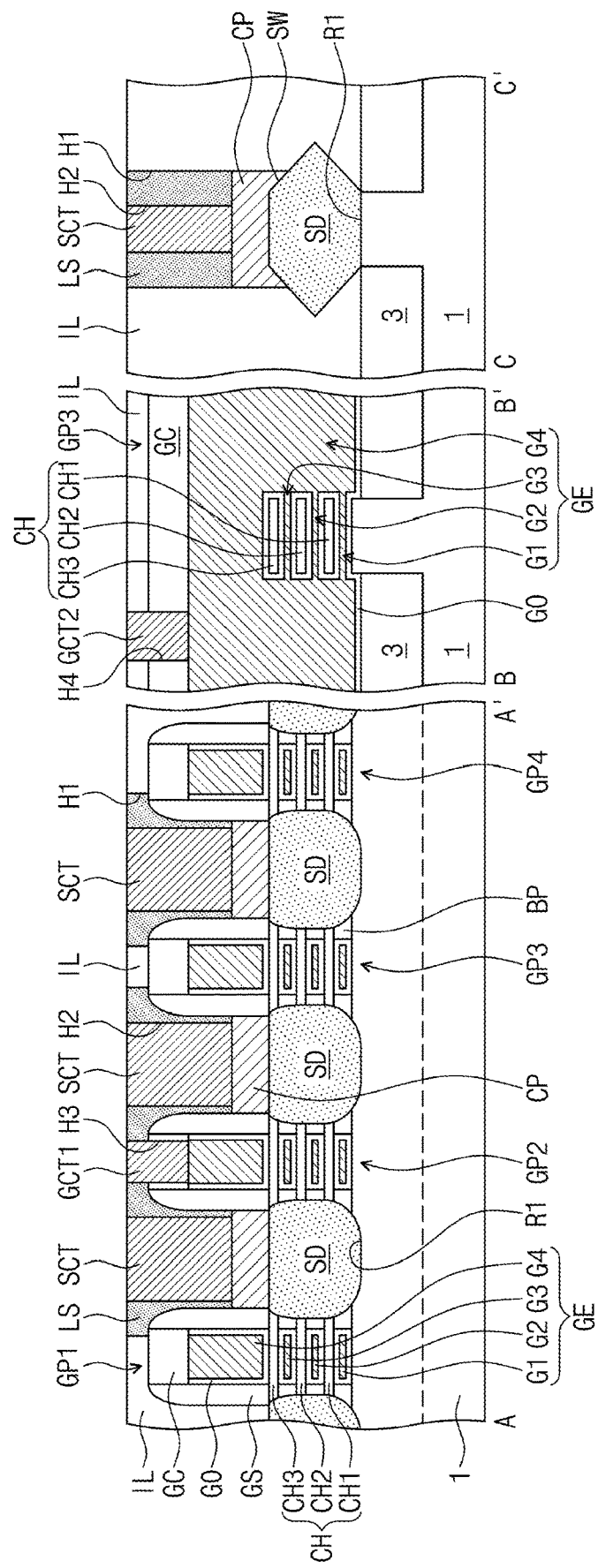
FIG. 1D illustrates a sectional view of a semiconductor device according to an embodiment, taken along the lines A-A', B-B', and C-C' of FIG. 1A.

FIG. 1D is a sectional view illustrating a semiconductor device according to an embodiment, taken along the lines A-A', B-B', and C-C' of FIG. 1A. The semiconductor device of FIG. 1D may correspond to an example of a multi-bridge channel field effect transistor (MBCFET®) device.

Referring to FIG. 1D, the semiconductor device according to the present embodiment may further include a barrier insulating pattern BP, which is interposed between the source/drain pattern SD and the gate insulating layer GO enclosing the first to third gate portions G1, G2, and G3. The barrier insulating pattern BP may be formed of or include a material (e.g., silicon nitride), which is different from the gate insulating layer GO. The barrier insulating pattern BP may prevent a bridge issue between the first to third gate portions GP1, GP2, and GP3 and the source/drain pattern SD, which may occur in a process of fabricating the semiconductor device of FIG. 1D, and this may make it possible to improve the reliability of the semiconductor device. Except for the above features, the semiconductor device according to the present embodiment may be configured to have substantially the same features as those of the semiconductor device described with reference to FIG. 1C.

In the semiconductor devices according to the embodiments of FIGS. 1A-1D, the top surface of the contact pad CP may be lower than top surfaces of the gate electrodes GE, e.g., along the third direction Z of FIG. 1B, so a distance between the contact pad CP and the gate electrodes GE may be increased to prevent a bridge issue between the contact pad CP and the gate electrodes GE. Further, due to the protection spacers LS, it may be possible to increase the distance between the gate electrodes GE and the source/drain contact plugs SCT, thereby preventing a bridge issue between the gate electrodes GE and the source/drain contact plugs SCT. In addition, since the protection spacers LS include a low-k dielectric material, it may be possible to reduce parasitic capacitance between the gate electrodes GE and the source/drain contact plugs SCT, thereby reducing or minimizing a signal interference issue. Accordingly, it may be possible to improve the reliability of the semiconductor device.

FIGS. 2A to 8A are plan views illustrating stages in a process of fabricating a semiconductor device having the planar structure shown in FIG. 1A. FIGS. 2B to 8B are sectional views taken along lines A-A', B-B', and C-C' of FIGS. 2A to 8A, respectively.

Figure 2A:
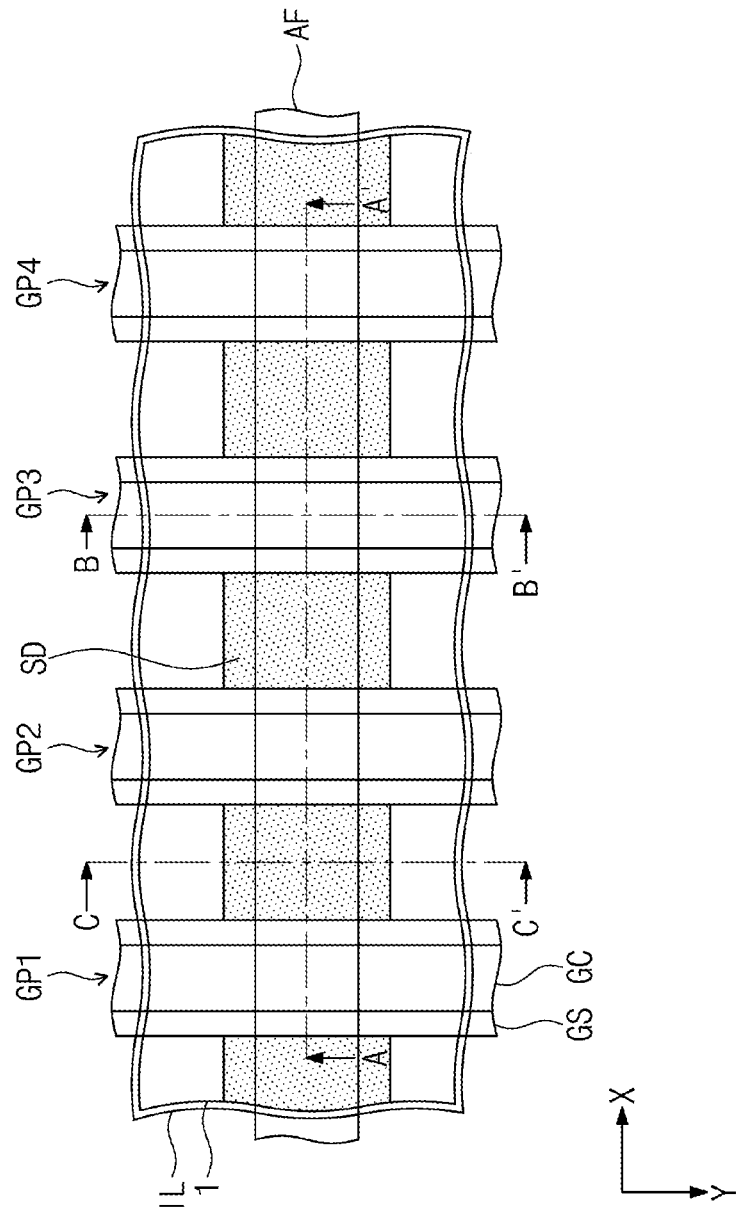
Figure 2B:
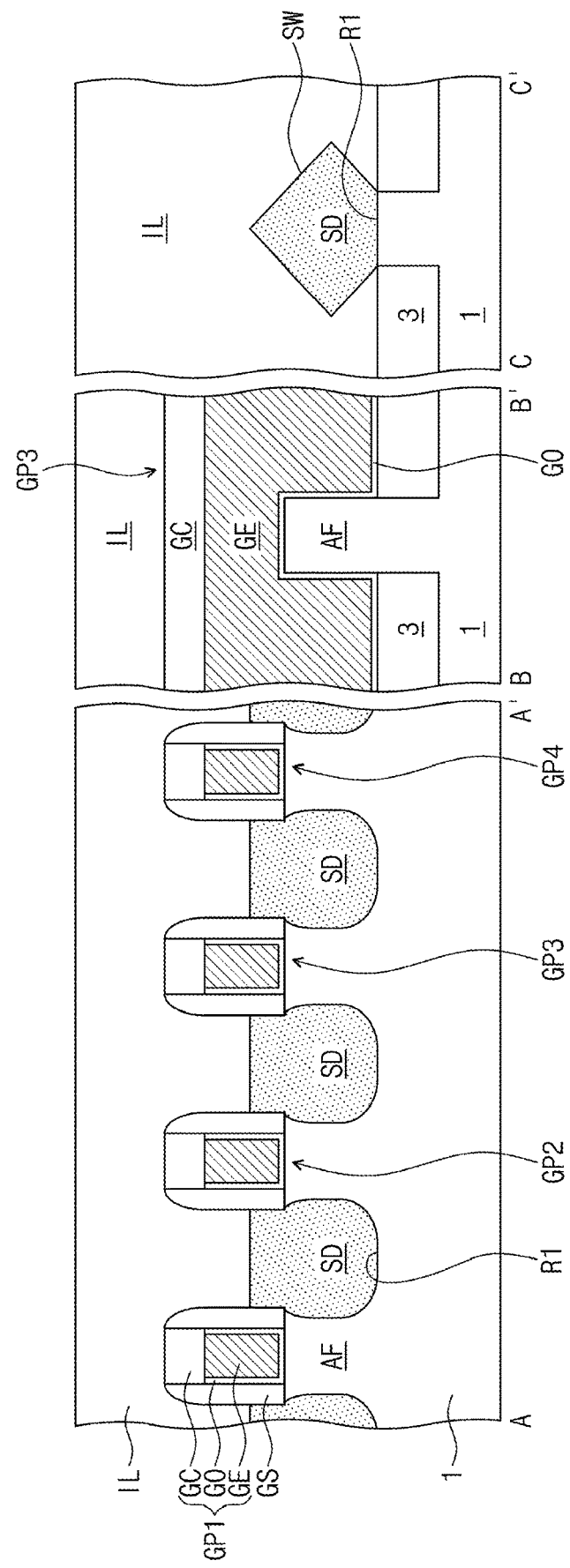

Referring to FIGS. 2A and 2B, the substrate 1 may be etched to form the active fin AF, which is a portion of the substrate 1. The device isolation layer 3 may be formed on portions of the substrate 1 located beside the active fin AF. Dummy gate patterns may be formed to cross the active fin AF, and the gate spacers GS may be formed to cover sidewalls of the dummy gate patterns. The recessed region R1 may be formed by etching an exposed portion of the active fin AF near the gate spacers GS. A selective epitaxial growth (SEG) process and an in-situ doping process may be performed to form the source/drain pattern SD in the recessed region R1. As shown in section C-C' of FIG. 2B, each of the source/drain patterns SD may be formed, e.g., in a diamond shape with the inclined upper sides SW. The dummy gate patterns may be removed, and then, the gate patterns GP1, GP2, GP3, and GP4 may be respectively formed in regions, e.g., openings, defined by the removed dummy gate patterns. The interlayered insulating layer IL may be formed to cover the gate patterns GP1, GP2, GP3, and GP4 and the source/drain patterns SD. In an embodiment, the interlayered insulating layer IL may be formed of or include, e.g., tetraethyl orthosilicate (TEOS).

Figure 3A:
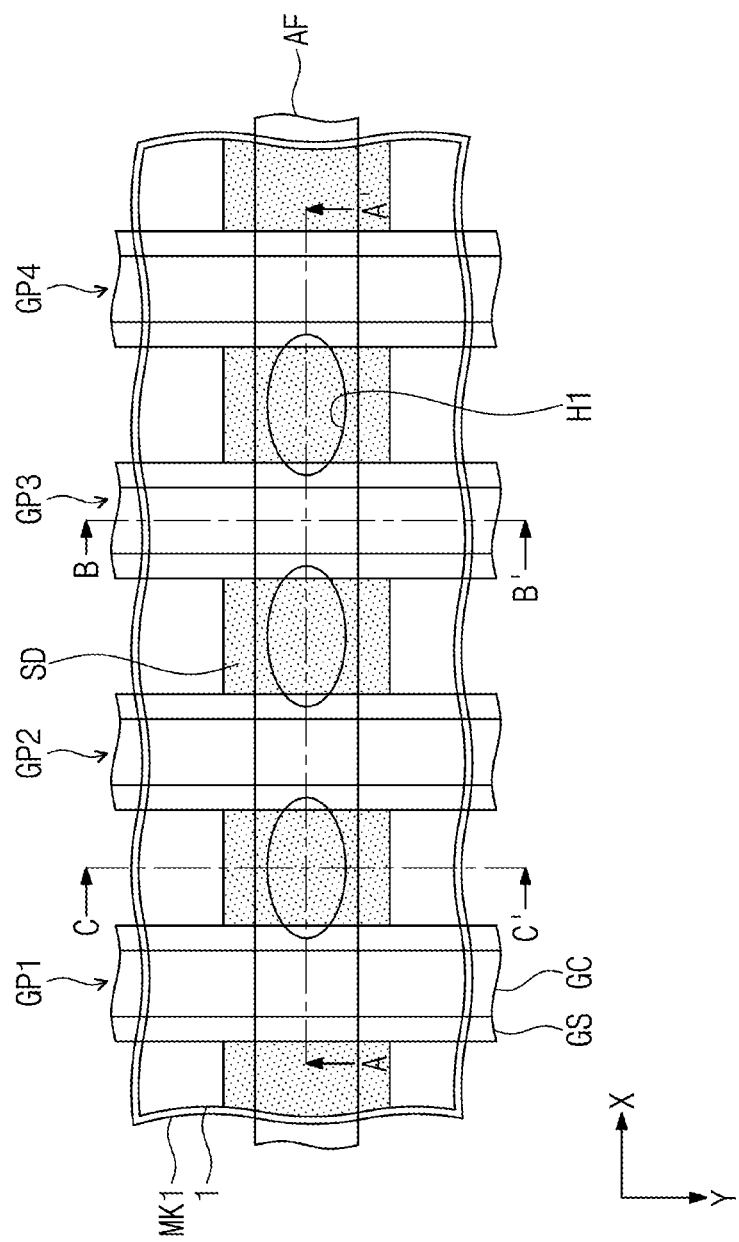
Figure 3B:
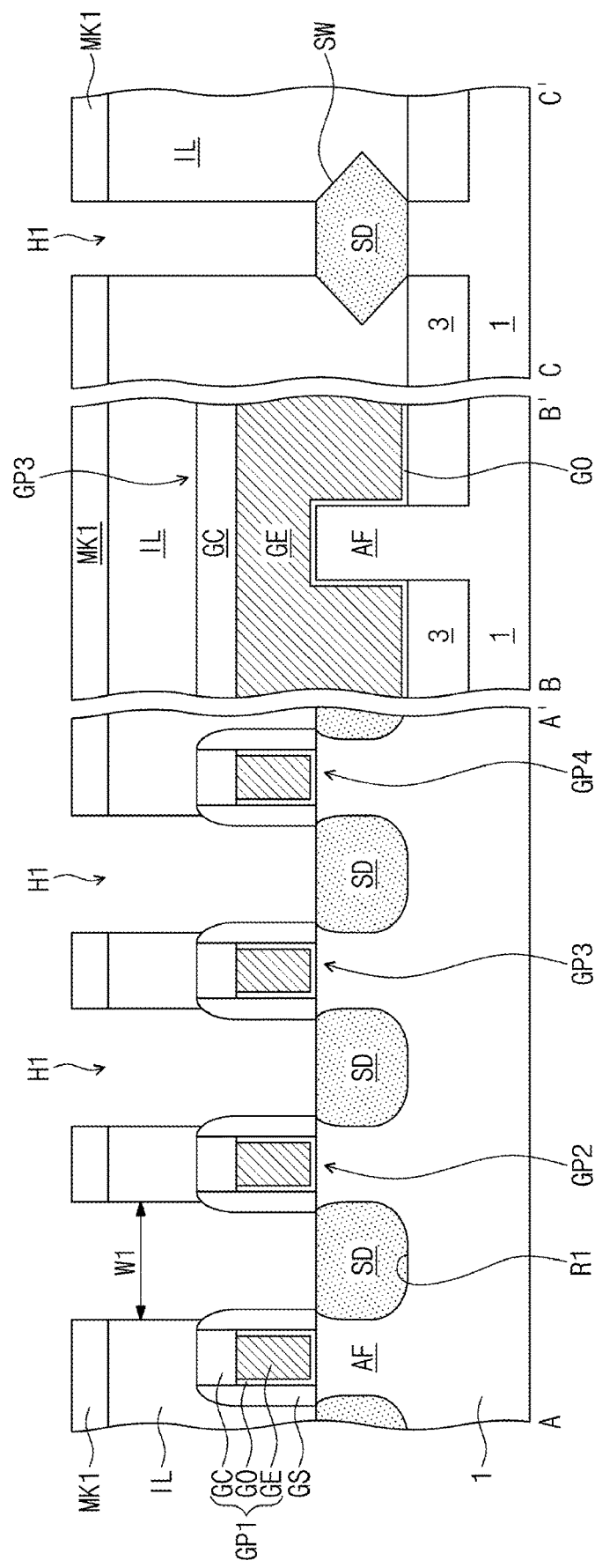

Referring to FIGS. 3A and 3B, a first mask pattern MK1 may be formed on the interlayered insulating layer IL. The first mask patterns MK1 may include openings overlapped with the source/drain patterns SD. The first mask patterns MK1 may be formed of or include at least one of materials (e.g., photoresist, polysilicon, spin-on-hardmask (SOH), spin-on-carbon (SOC), and amorphous carbon layer (ACL) materials), which have an etch selectivity with respect to the interlayered insulating layer IL. The interlayered insulating layer IL may be anisotropically etched using the first mask patterns MK1 as an etch mask, to form the first holes H1 exposing the source/drain patterns SD, respectively. Here, an upper portion of the source/drain pattern SD may also be etched, as shown in section C-C' of FIG. 3B. Each of the first holes H1 may be formed to have a first width W1, e.g., as measured along the first direction X of FIG. 2A between facing sidewalls of the interlayered insulating layer IL of FIG. 3B. The first hole H1 may expose a sidewall of the gate spacer GS. Even when a misalignment occurs during formation of the first holes H1, the sidewalls of the gate patterns GP1, GP2, GP3, and GP4 may be protected by the gate spacer GS. The anisotropic etching process for forming the first holes H1 may be performed by a self-aligned method using the etch selectivity of the gate spacer GS. In certain cases, the anisotropic etching process may lead to damage of an upper portion of the gate spacer GS.

Figure 4A:
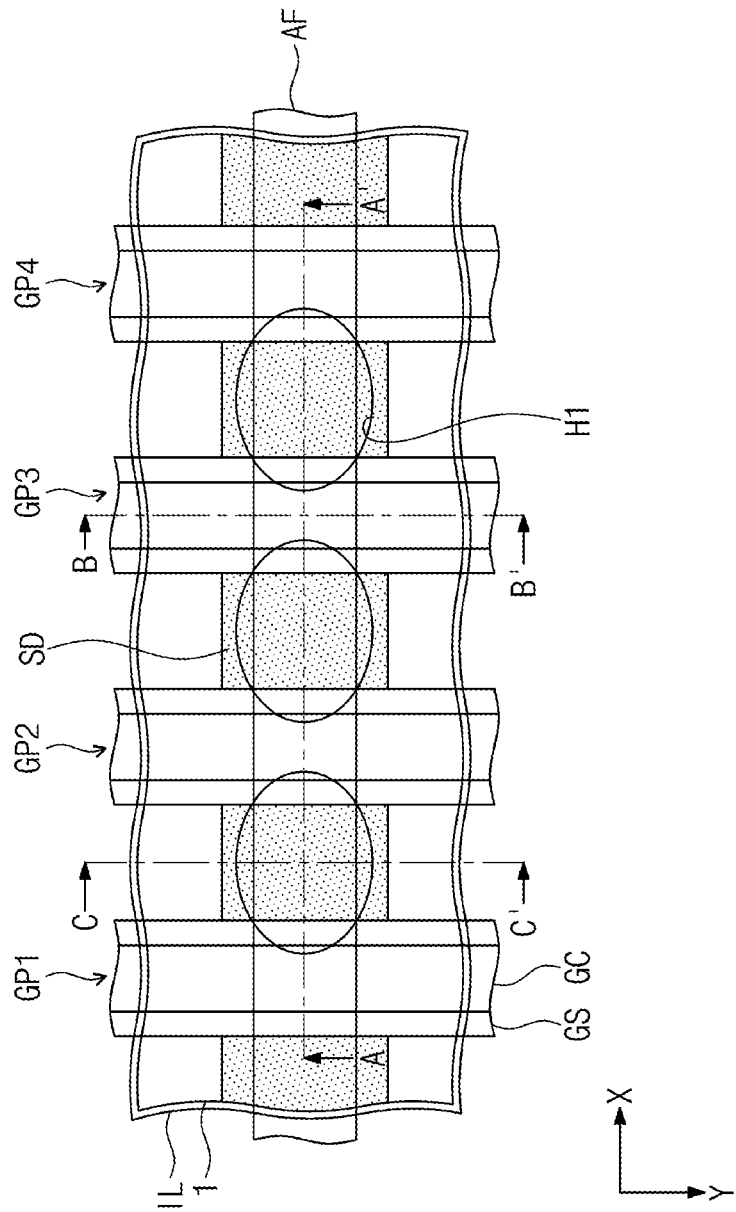
Figure 4B:
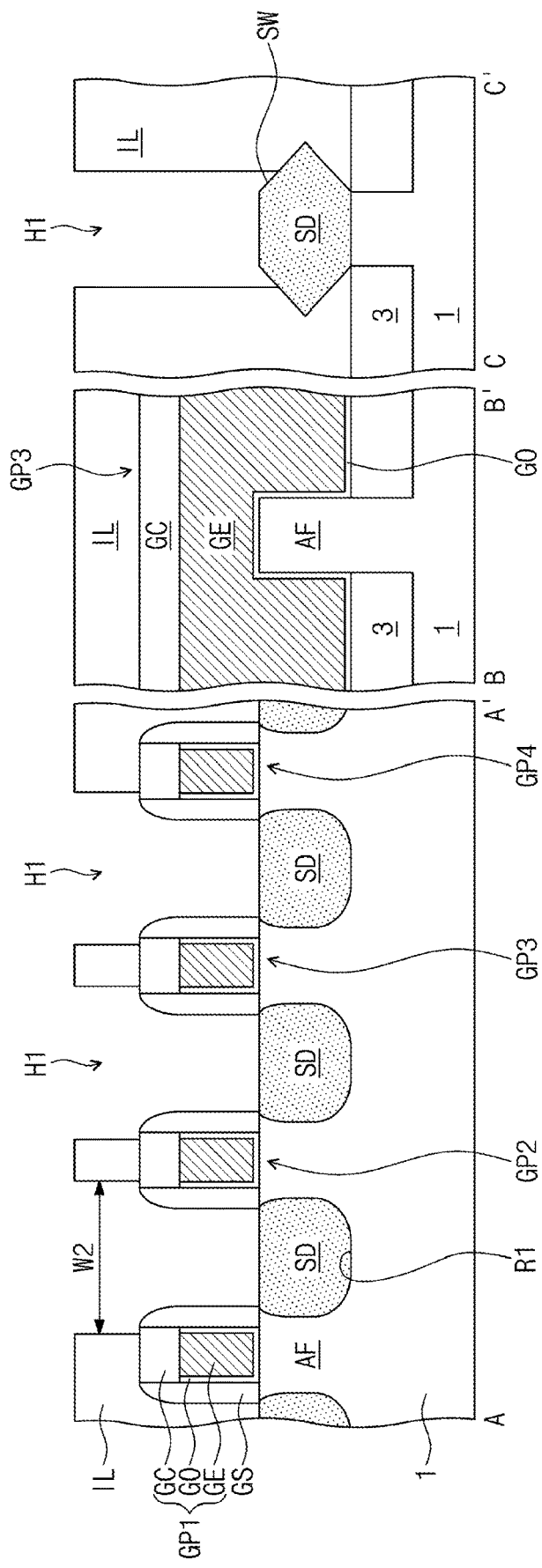

Referring to FIGS. 4A and 4B, the first mask pattern MK1 may be removed to expose the top surface of the interlayered insulating layer IL. An isotropic etching process of selectively etching the interlayered insulating layer IL may be performed to enlarge the width of the first holes H1 to a second width W2, e.g., as measured along the first direction X of FIG. 2A between facing sidewalls of the etched interlayered insulating layer IL of FIG. 4B, which is greater than the first width W1. The first holes H1 may have widths enlarged also along the second direction Y of FIG. 2A, so the inclined upper sides SW of the source/drain pattern SD may be at least partially exposed, as shown in section C-C' of FIG. 4B. The isotropic etching process may be performed using, e.g., hydrofluoric acid or hydrogen fluoride gas. Since the isotropic etching process is performed to selectively etch the interlayered insulating layer IL, it may be possible to prevent the gate spacer GS from being damaged during the isotropic etching process.

Figure 5A:
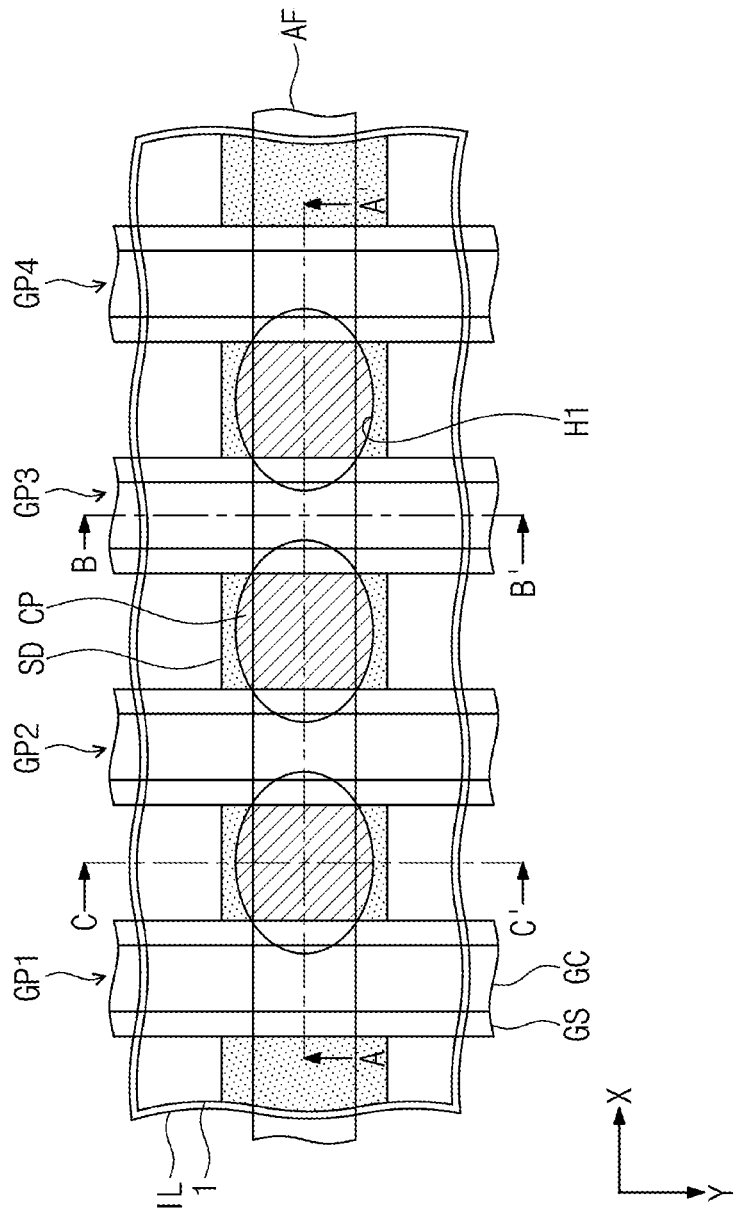
Figure 5B:
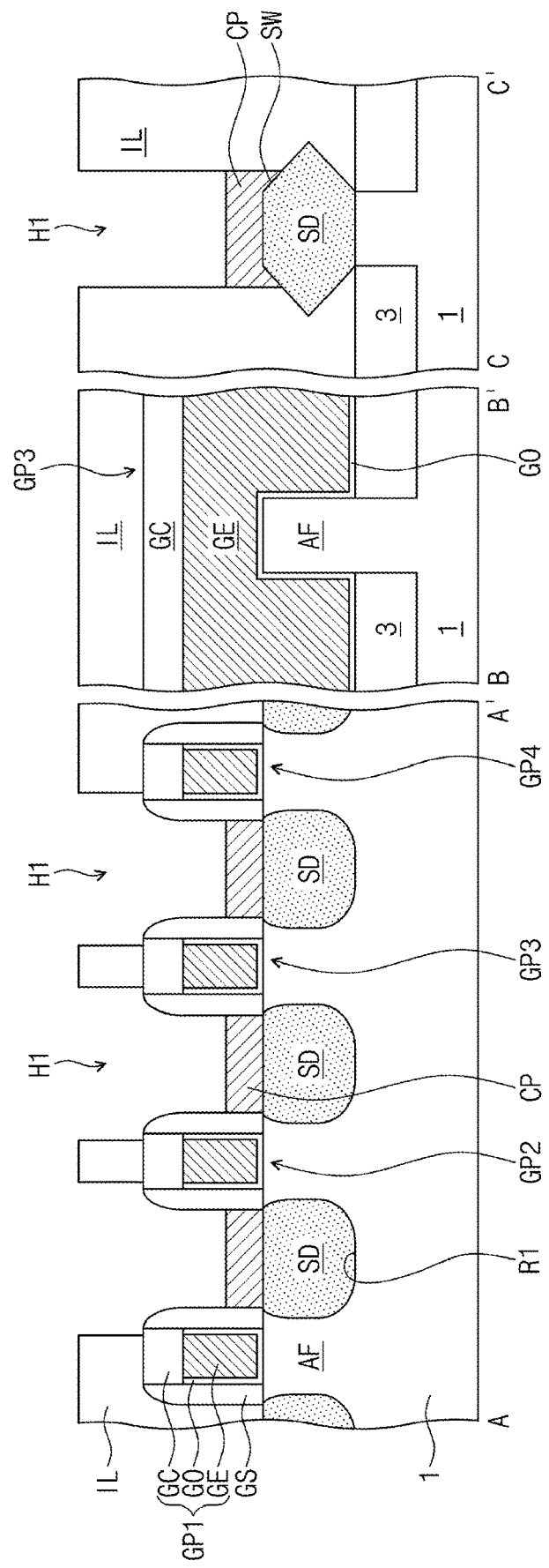

Referring to FIGS. 5A and 5B, a conductive layer may be formed on the substrate 1 and may be recessed by, e.g., an etch-back process. Thus, the contact pad CP may be formed in the first holes H1. Here, since the first holes H1 are enlarged to have the second width W2, it may be possible to effectively supply a deposition source gas and an etchant through the first holes H1, thereby more effectively performing the processes of forming and recessing the conductive layer. In an embodiment, the contact pad CP may be normally formed, without any failure. The contact pad CP may be in contact with the inclined upper sides SW of the source/drain pattern SD. The top surface of the contact pad CP may be lower than the top surface of the gate electrode GE. In certain cases, an upper portion of the gate spacer GS may be damaged by the etch-back process.

Referring to FIGS. 5A, 5B, 6A, and 6B, a protection layer may be formed on the substrate 1, and then, an etch-back process on the protection layer may be performed to form the protection spacer LS covering an inner sidewall of the first hole H1. In certain embodiments, the formation of the protection spacer LS may include filling the holes H1 with the protection layer, performing a chemical-mechanical polishing (CMP) process to form protection patterns in the first holes H1, and performing an anisotropic etching process on the protection patterns. Due to the protection spacers LS, the second holes H2 may be formed to partially expose the top surfaces of the contact pads CP. The protection spacer LS may cover and protect the damaged upper portion of the gate spacer GS.

Referring to FIGS. 6A, 6B, 7A, and 7B, a second mask pattern MK2 may be formed on the substrate 1. The second mask pattern MK2 may include openings, which are overlapped with a portion of the second gate pattern GP2 between adjacent ones of the protection spacers LS and a portion of the third gate pattern GP3 spaced apart from the protection spacers LS. The second mask pattern MK2 may be formed of or include, e.g., at least one of spin-onhardmask (SOH) materials. The second mask pattern MK2 may fill the second holes H2. The interlayered insulating layer IL and the gate capping patterns GC of the second and third gate patterns GP2 and GP3 may be etched using the second mask pattern MK2 as an etch mask. Thus, the third hole H3 and the fourth hole H4 may be formed to expose the gate electrodes GE, respectively. The second mask pattern MK2 may protect the protection spacer LS and the contact pad CP, during the formation of the third hole H3 and the fourth hole H4.

Referring to FIGS. 7A, 7B, 8A, and 8B, the second mask pattern MK2 may be removed to expose the second to fourth holes H2, H3, and H4. The removal of the second mask pattern MK2 may be performed by, e.g., an ashing process, in which oxygen is used.

Referring to FIGS. 8A, 8B, 1A, and 1B, a conductive layer may be formed on the substrate 1 to fill the second to fourth holes H2, H3, and H4. Thereafter, a CMP process may be performed to form the source/drain contact plugs SCT, the first gate contact plug GCT1, and the second gate contact plug GCT2 in the second to fourth holes H2, H3, and H4, respectively. In certain embodiments, upper portions of the protection spacers LS and an upper portion of the interlayered insulating layer IL may also be removed during the CMP process.

If the protection spacers LS were not formed, the conductive layer could have contacted the gate electrode GE through the damaged upper portion of the gate spacer GS during formation of the conductive layer, thereby potentially forming a bridge between the source/drain contact plugs SCT and the gate electrode GE. With increasing integration density of a semiconductor device, a width of the gate spacer GS decreases, thereby increasing a potential of forming such a bridge.

In contrast, according to an embodiment, the protection spacers LS prevent formation of such a bridge. Furthermore, when the protection spacers LS are formed at specific desired regions, e.g., not to cover the entire top surface of the interlayered insulating layer IL, the fabrication method may exhibit reduced process failure and improved production yield, e.g., as process conditions do not need to be changed to determine an etch stop point to account for an entire top surface covered by the interlayered insulating layer IL.

Figure 9A:
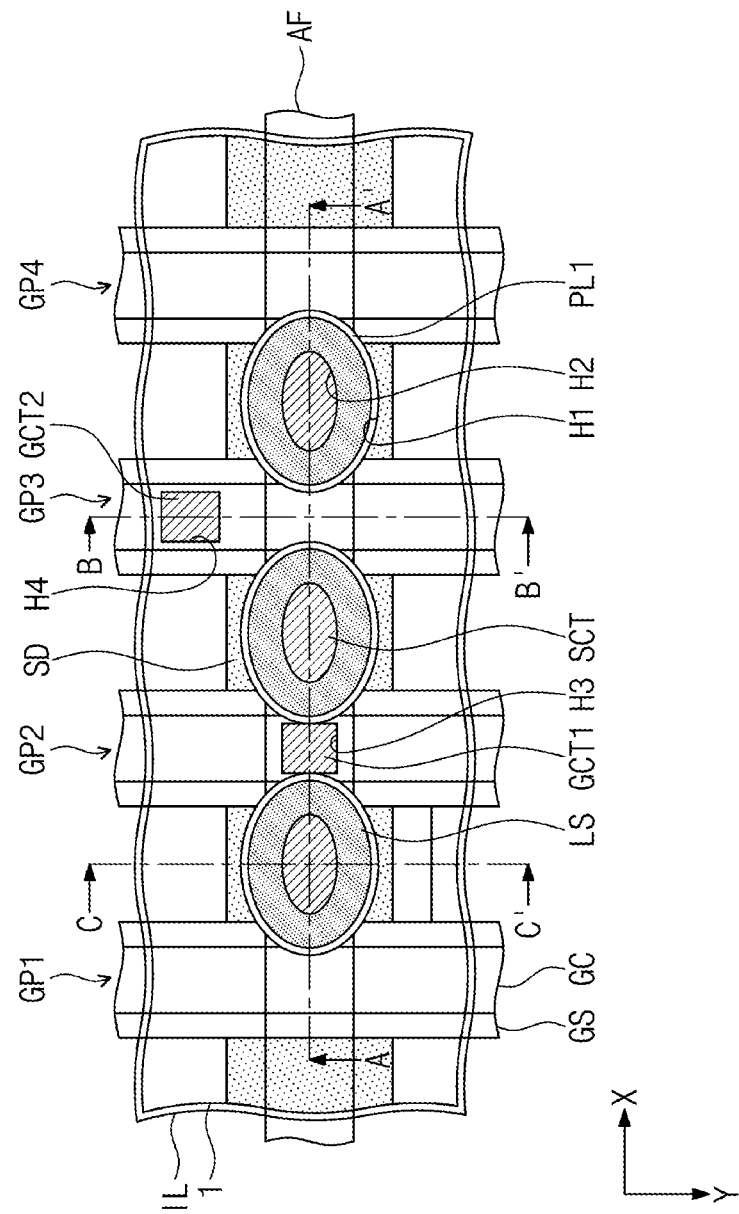
FIG. 9A illustrates a plan view of a semiconductor device according to an embodiment.
Figure 9B:
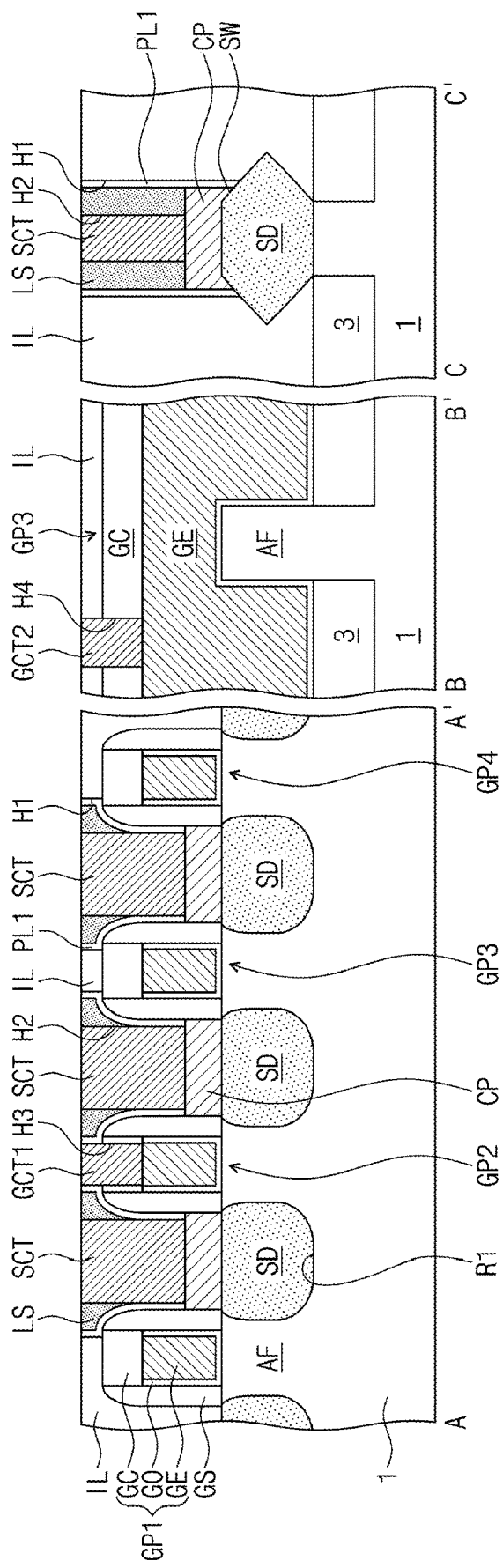
FIG. 9B illustrates a sectional view taken along lines A-A', B-B', and C-C' of FIG. 9A.

FIG. 9A is a plan view illustrating a semiconductor device according to an embodiment. FIG. 9B is a sectional view taken along lines A-A', B-B', and C-C' of FIG. 9A.

Referring to FIGS. 9A and 9B, a first auxiliary insulating pattern PL1 may be interposed between the inner sidewall of the first hole H1 and the protection spacer LS. The first auxiliary insulating pattern PL1 may be formed of or include a different material from the protection spacer LS. The first auxiliary insulating pattern PL1 may be formed of or include the same material (e.g., silicon nitride) as the gate spacer GS. The first auxiliary insulating pattern PL1 may be used to reinforce a damaged portion of the gate spacer GS. The first auxiliary insulating pattern PL1 may be interposed between the protection spacer LS and the gate spacer GS and between the protection spacer LS and the interlayered insulating layer IL. The first auxiliary insulating pattern PL1 may have a ring shape enclosing the protection spacer LS, when viewed in a plan view.

Figure 10:
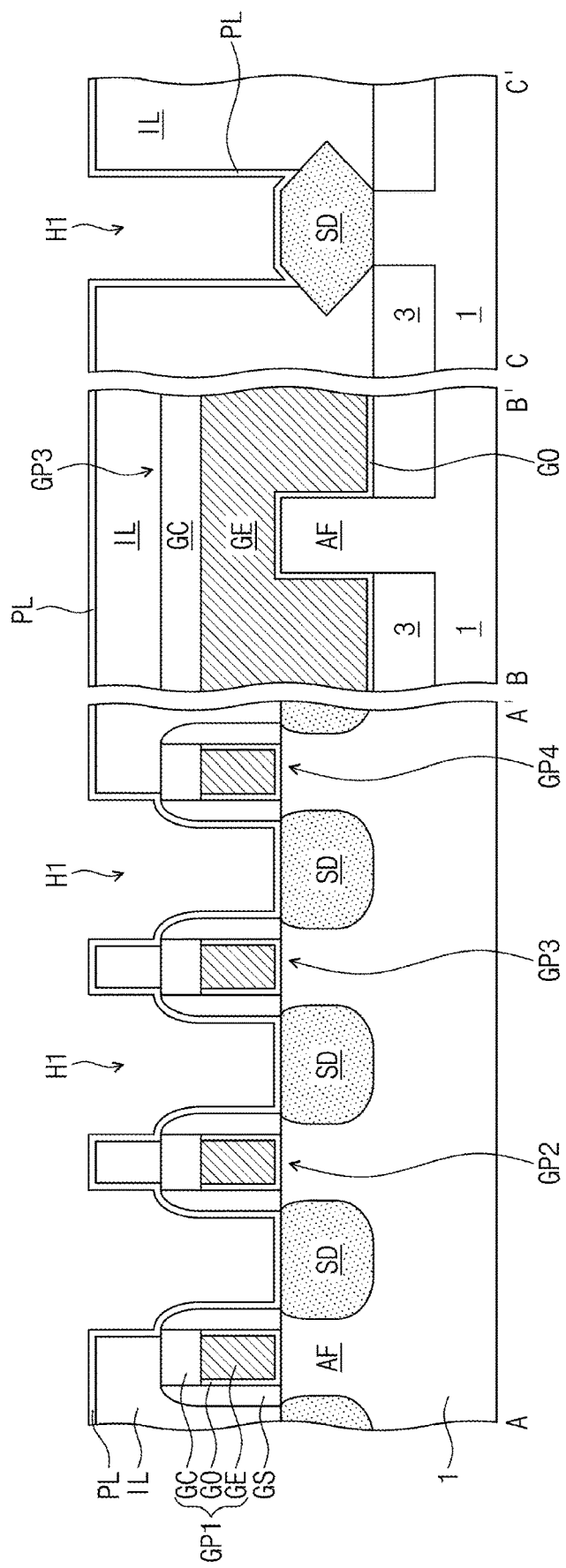
FIG. 10 illustrates a sectional view of a process of fabricating a semiconductor device having the section of FIG. 9B.

FIG. 10 is a sectional view illustrating a process of fabricating the semiconductor device of FIGS. 9A and 9B.

Figure 6A:
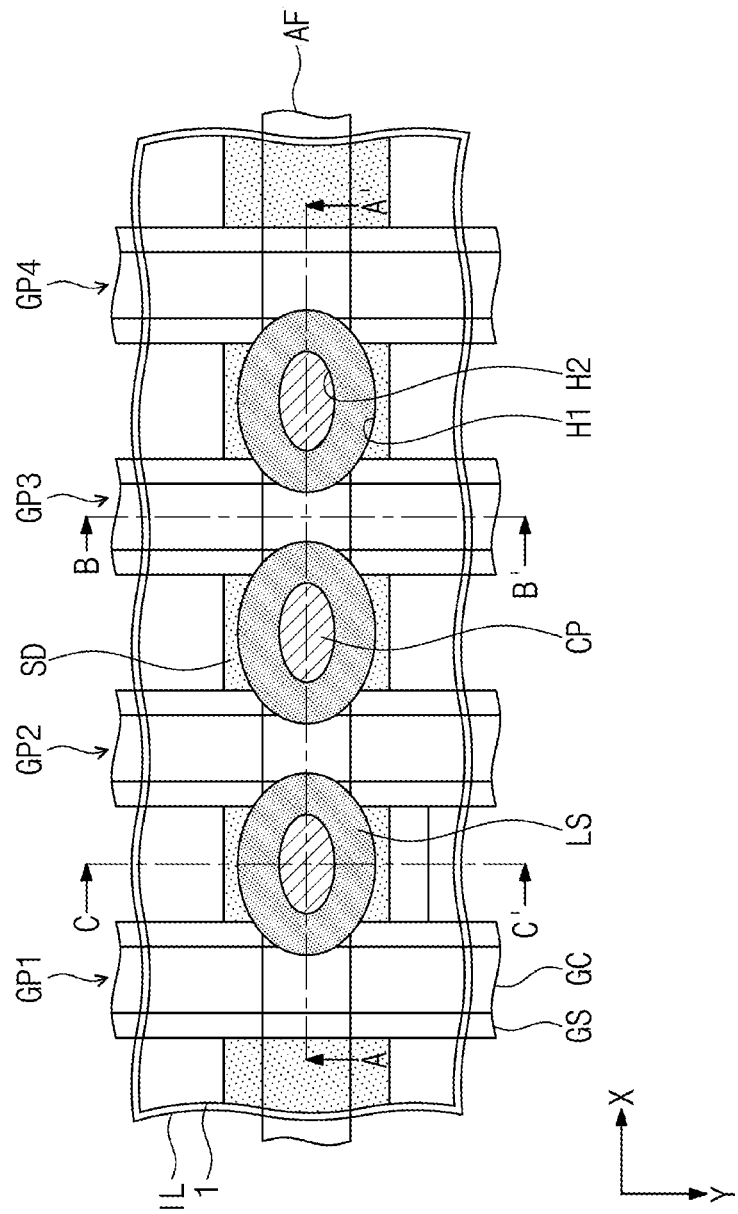
Figure 6B:
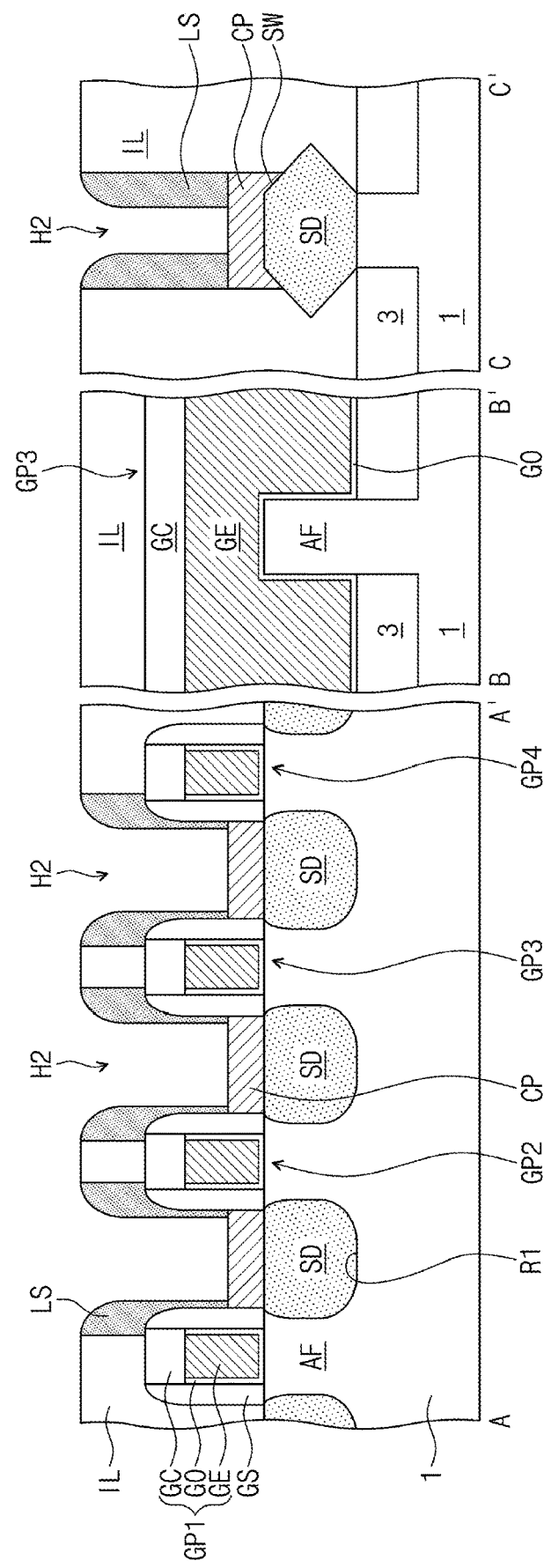
Figure 7A:
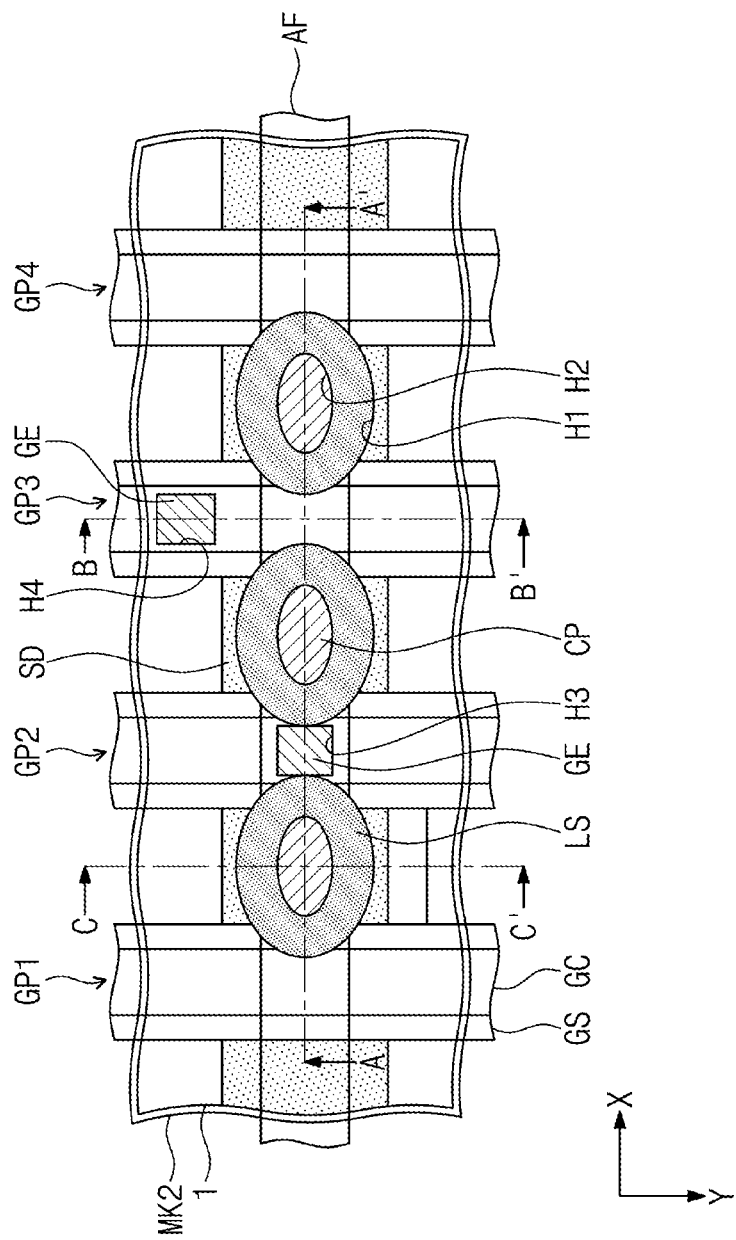
Figure 7B:
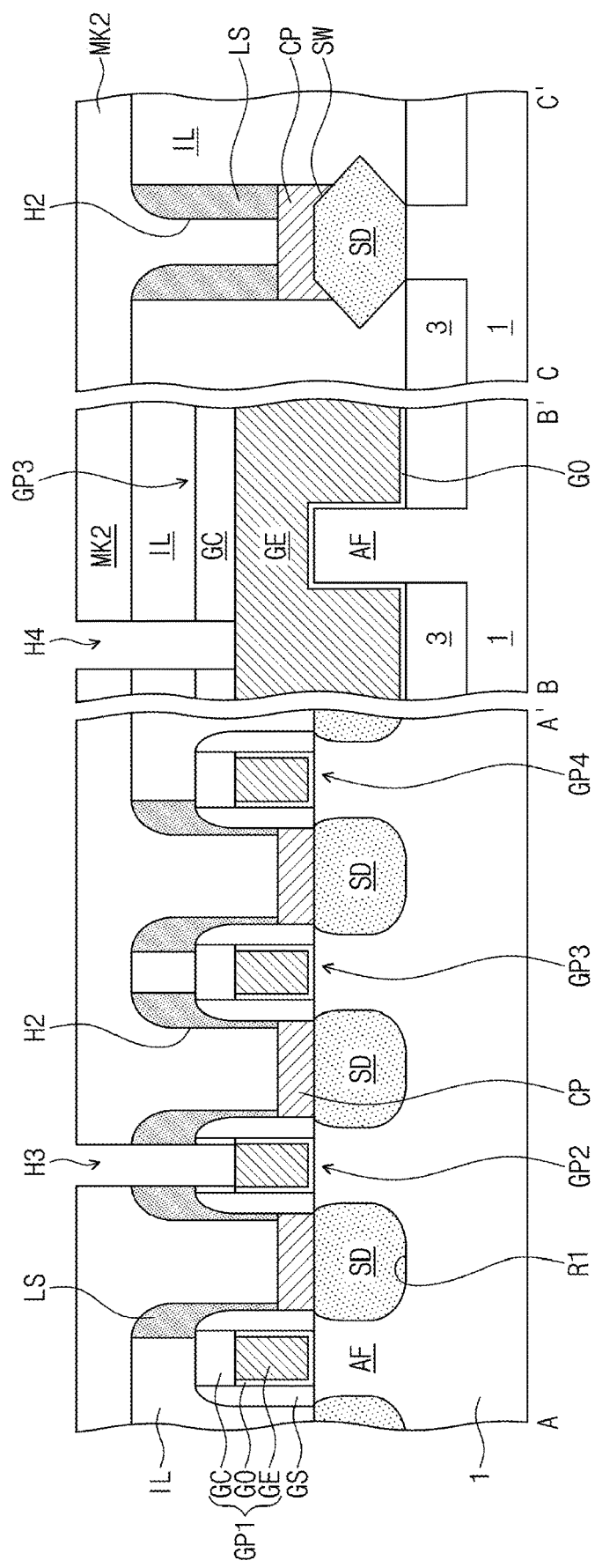

Referring to FIG. 10, an auxiliary insulating layer PL may be formed on the substrate 1 to conformally cover the structure of FIG. 5B, in which the width of the first hole H1 is enlarged. The auxiliary insulating layer PL may be used to reinforce a damaged portion of the gate spacer GS, which may be formed during the process of forming the first hole H1. Thereafter, the protection spacer LS may be formed, as shown in FIG. 6B. Here, the auxiliary insulating layer PL may also be etched to form the first auxiliary insulating pattern PL1. Subsequent processes may be performed in the same manner as those described with reference to FIGS. 7B and 8B.

Figure 11A:
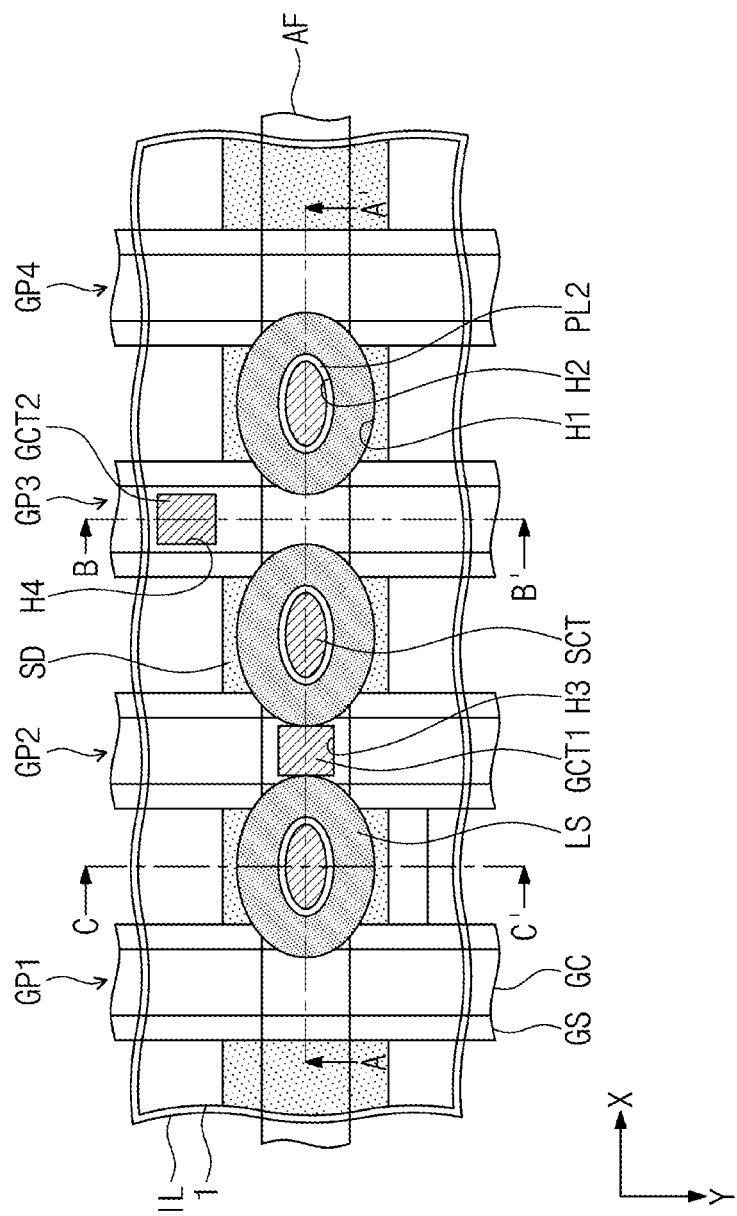
FIG. 11A illustrates a plan view of a semiconductor device according to an embodiment.
Figure 11B:
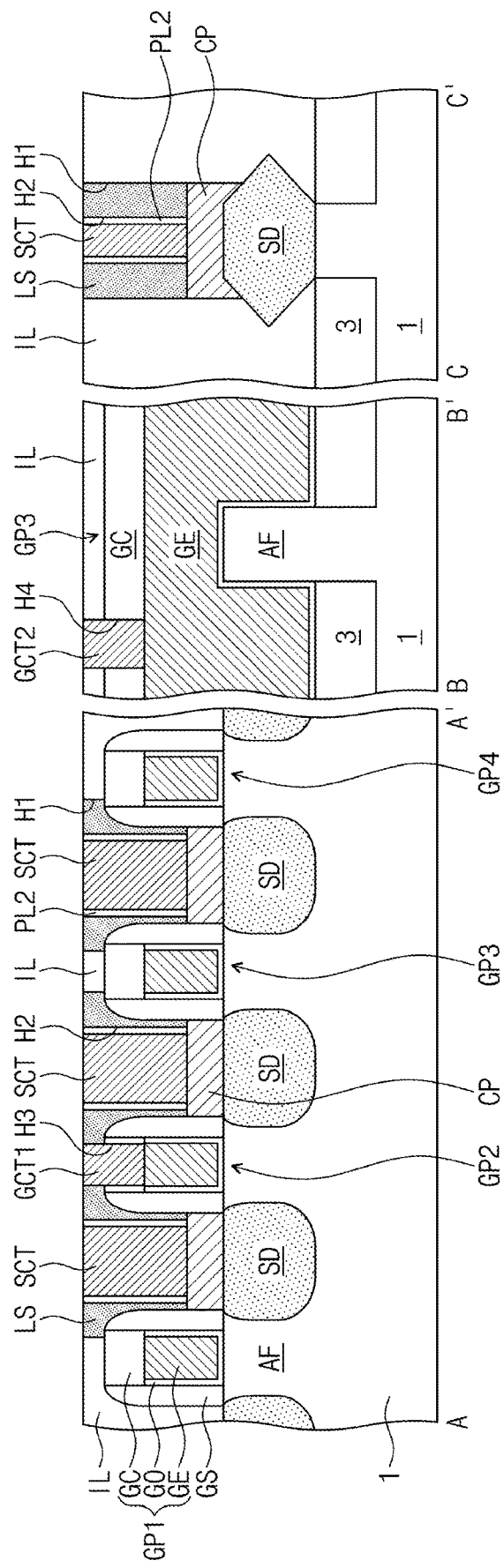
FIG. 11B illustrates a sectional view taken along lines A-A', B-B', and C-C' of FIG. 11A.

FIG. 11A is a plan view illustrating a semiconductor device according to an embodiment. FIG. 11B is a sectional view taken along lines A-A', B-B', and C-C' of FIG. 11A.

Referring to FIGS. 11A and 11B, a second auxiliary insulating pattern PL2 may be interposed between the inner sidewall of the second hole H2 and the source/drain contact plug SCT. The second auxiliary insulating pattern PL2 may be formed of or include a material, which is different from the protection spacer LS. For example, the second auxiliary insulating pattern PL2 may be formed of or include at least one of silicon nitride, silicon oxide, or silicon oxynitride. The second auxiliary insulating pattern PL2 may be interposed between the protection spacer LS and the source/drain contact plug SCT. The second auxiliary insulating pattern PL2 may have a ring shape enclosing the source/drain contact plug SCT, when viewed in a plan view.

Figure 12:
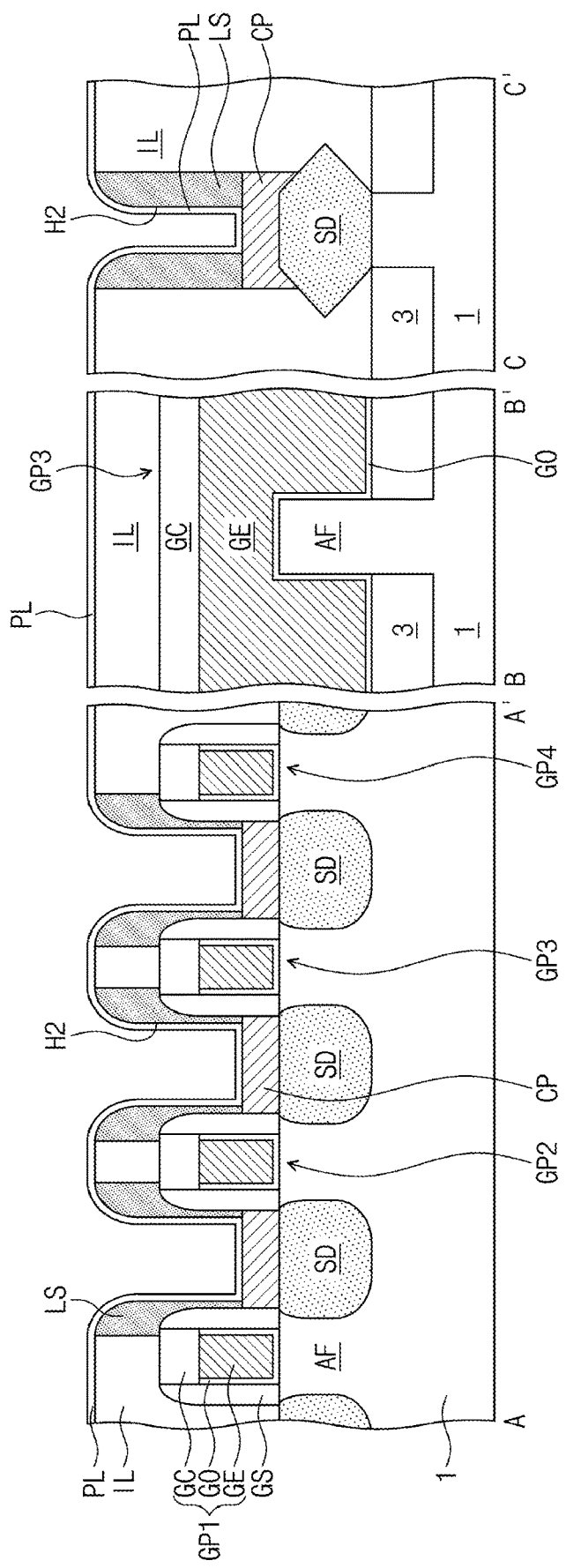
FIG. 12 illustrates a sectional view of a process of fabricating a semiconductor device having the section of FIG. 11B.

FIG. 12 is a sectional view illustrating a process of fabricating the semiconductor of FIGS. 11A and 11B.

Referring to FIG. 12, the auxiliary insulating layer PL may be conformally formed on the entire top surface of the substrate 1, after forming the protection spacer LS as shown in FIG. 6B. Thereafter, an anisotropic etching process on the auxiliary insulating layer PL may be performed to form the second auxiliary insulating pattern PL2. Subsequent processes may be performed in the same manner as those described with reference to FIGS. 7B and 8B.

Figure 13A:
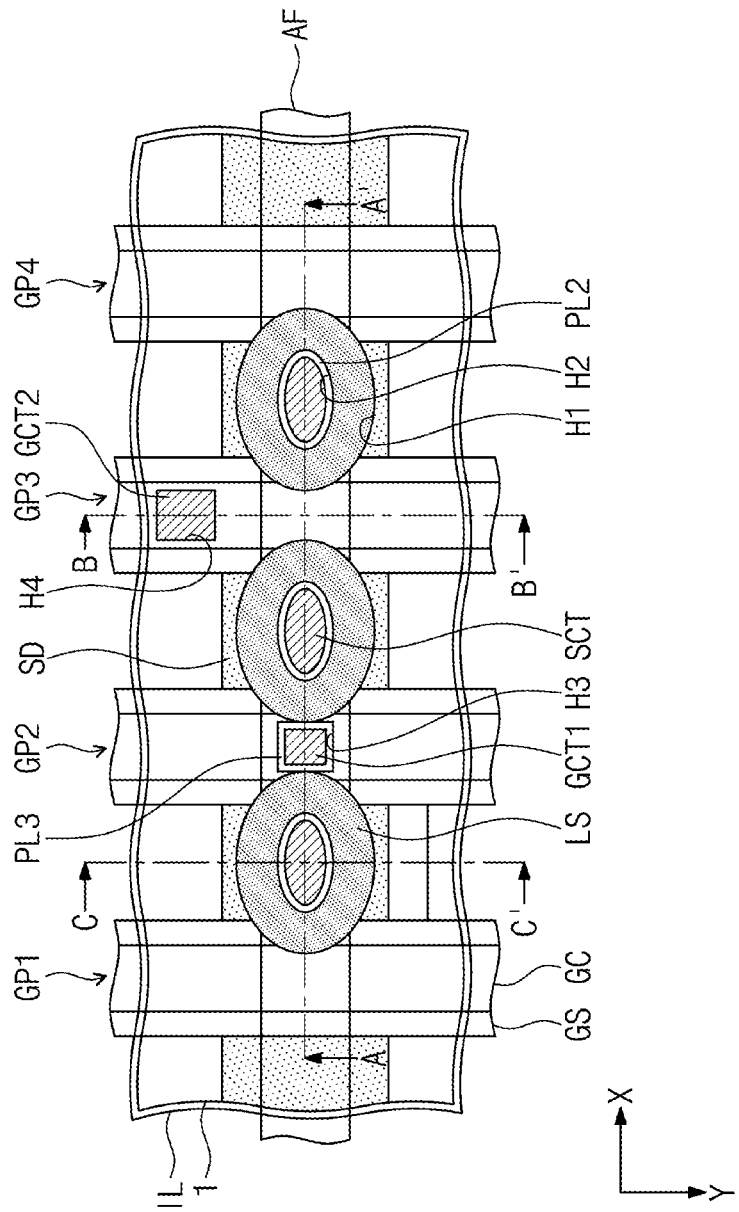
FIG. 13A illustrates a plan view of a semiconductor device according to an embodiment.
Figure 13B:
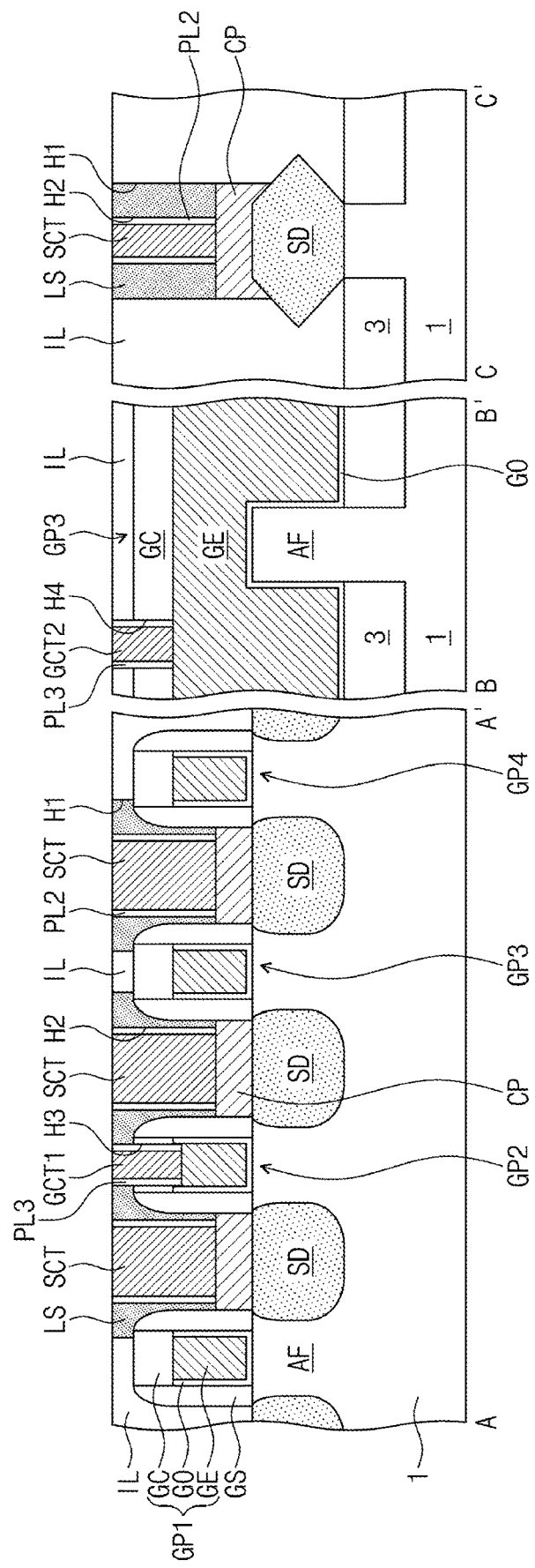
FIG. 13B illustrates a sectional view taken along lines A-A', B-B', and C-C' of FIG. 13A.

FIG. 13A is a plan view illustrating a semiconductor device according to an embodiment. FIG. 13B is a sectional view taken along lines A-A', B-B', and C-C' of FIG. 13A.

Referring to FIGS. 13A and 13B, the second auxiliary insulating pattern PL2 may be interposed between the inner sidewall of the second hole H2 and the source/drain contact plug SCT. In addition, a third auxiliary insulating pattern PL3 may be interposed between the inner sidewall of the third hole H3 and the first gate contact plug GCT1 and between the inner sidewall of the fourth hole H4 and the second gate contact plug GCT2. The third auxiliary insulating pattern PL3 may be interposed between the protection spacer LS and the first gate contact plug GCT1. The second auxiliary insulating pattern PL2 and the third auxiliary insulating pattern PL3 may be formed of or include a material different from the protection spacer LS. The second auxiliary insulating pattern PL2 may be formed of or include the same material as the third auxiliary insulating pattern PL3. The second auxiliary insulating pattern PL2 and the third auxiliary insulating pattern PL3 may be formed of or include at least one of, for example, silicon nitride, silicon oxide, or silicon oxynitride. The second auxiliary insulating pattern PL2 may have a ring shape enclosing the source/drain contact plug SCT, when viewed in a plan view. The third auxiliary insulating pattern PL3 may have a ring shape enclosing the first or second gate contact plug GCT1 or GCT2, when viewed in a plan view.

Figure 14:
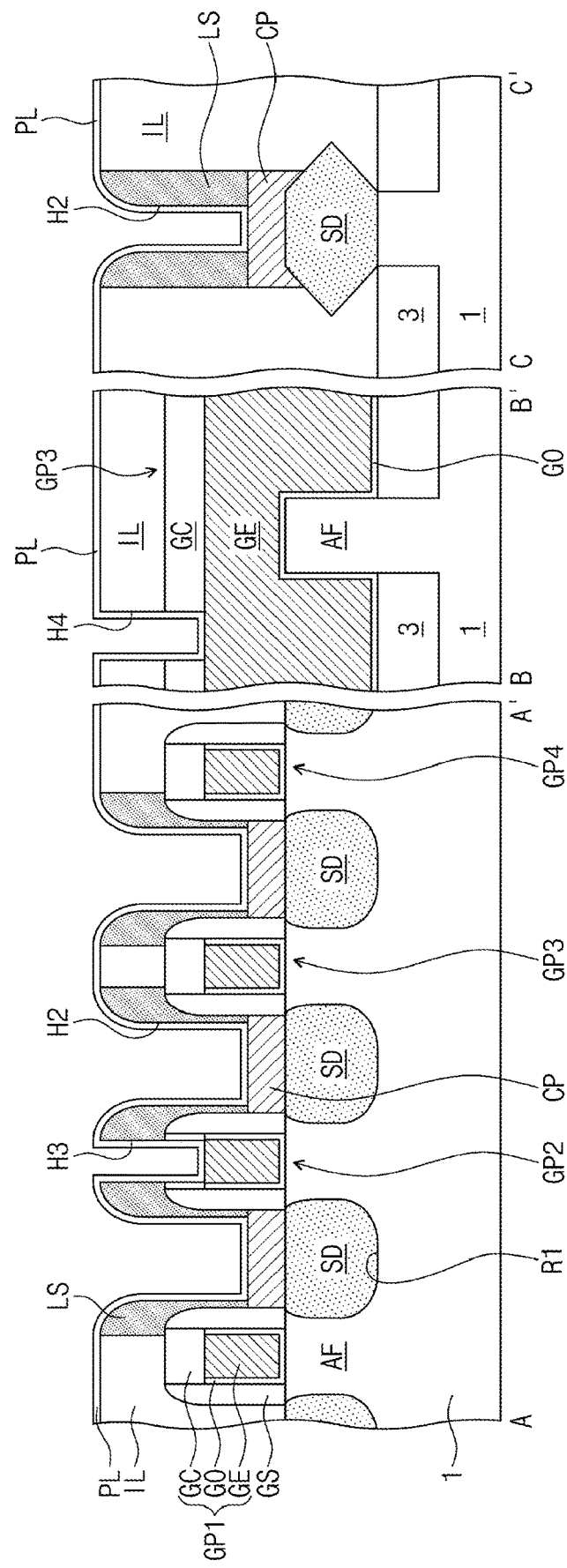
FIG. 14 illustrates a sectional view of a process of fabricating a semiconductor device having the section of FIG. 13B.

FIG. 14 is a sectional view illustrating a process of fabricating the semiconductor of FIGS. 13A and 13B.

Figure 8A:
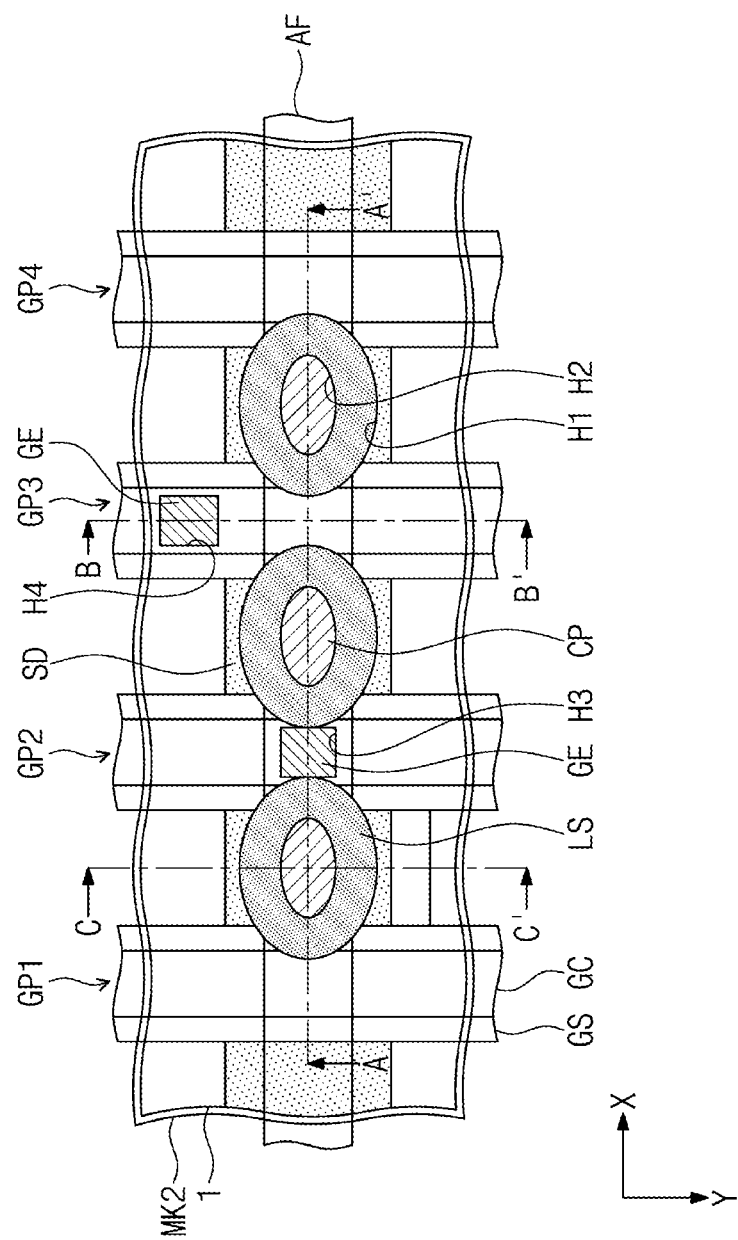
Figure 8B:
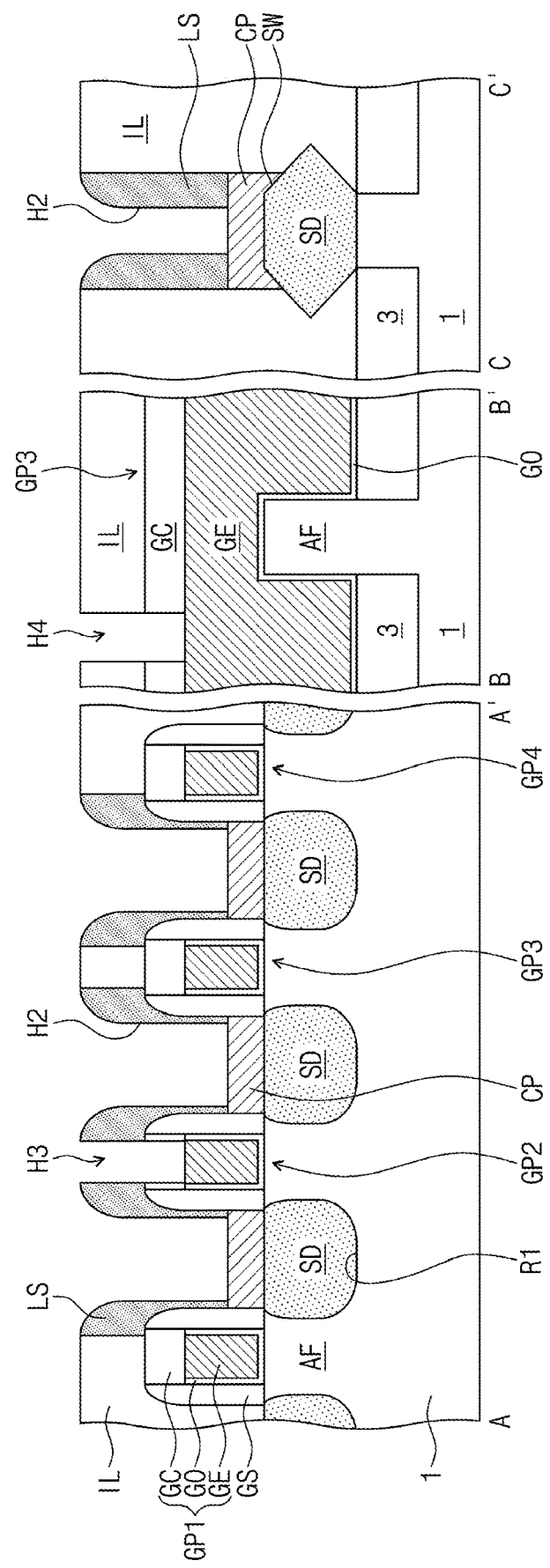

Referring to FIG. 14, the auxiliary insulating layer PL may be conformally formed after exposing the second to fourth holes H2, H3, and H4 as shown in FIG. 8B and before forming the conductive layer. Thereafter, an anisotropic etching process may be performed on the auxiliary insulating layer PL to form the second auxiliary insulating pattern PL2 and the third auxiliary insulating pattern PL3. Next, the conductive layer may be formed in the same or similar manner as those described with reference to FIGS. 13A and 13B, and a CMP process may be performed on the conductive layer.

The embodiments described with reference to FIGS. 9A to 14 may be combined with each other in various forms under a non-contradictable condition. For example, the semiconductor devices in the combined embodiments may be configured to include all of the first to third auxiliary insulating patterns PL1, PL2, and PL3 or to include only the first and second auxiliary insulating patterns PL1 and PL2.

Figure 15:
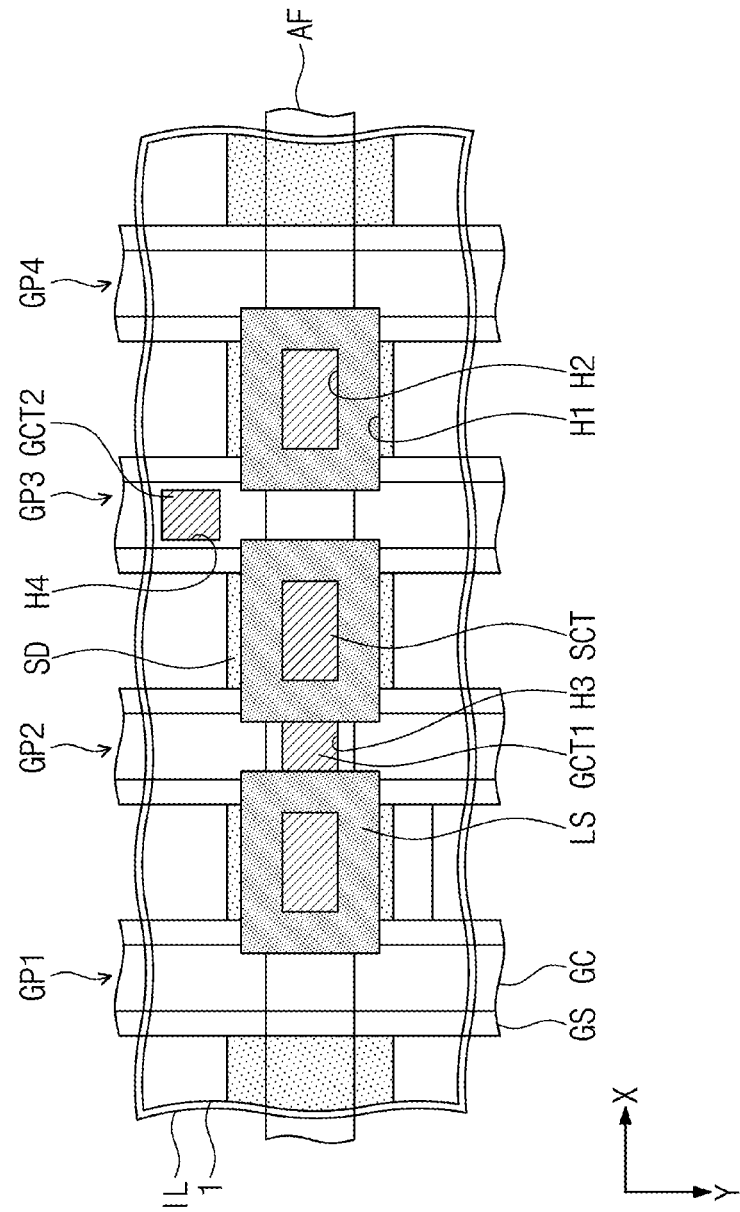
Figure 16:
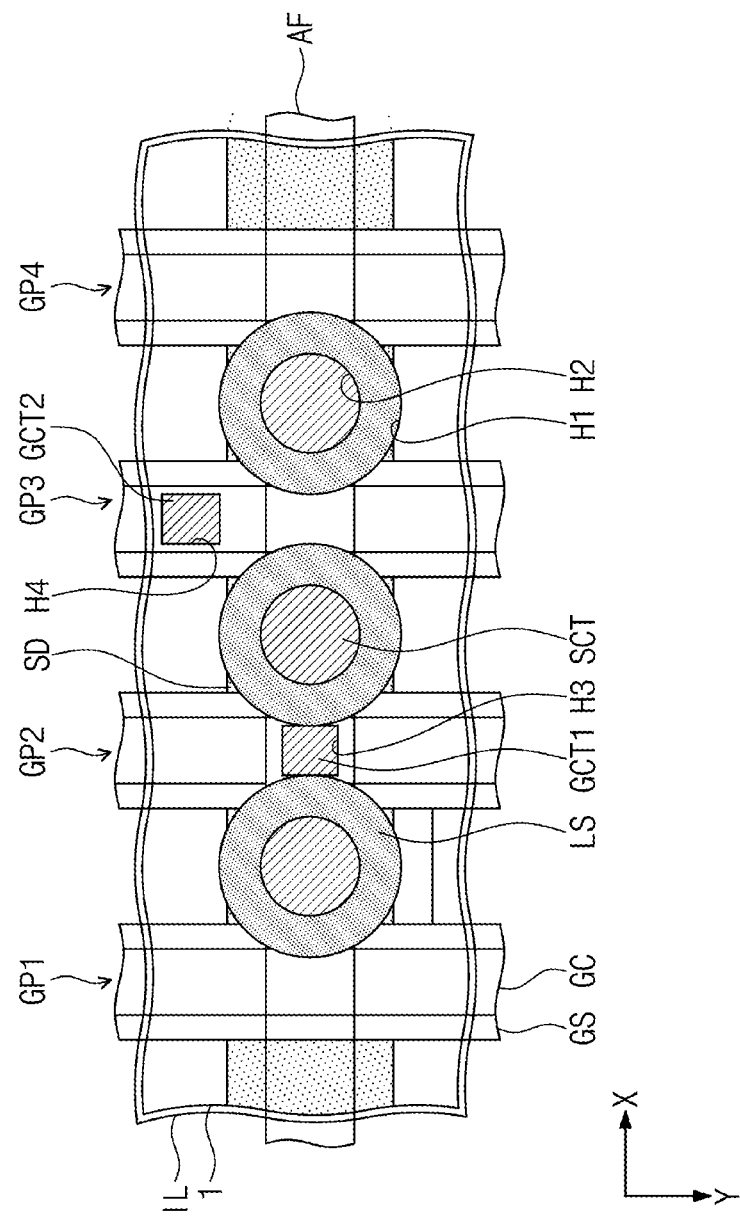

FIGS. 15 and 16 are plan views, each of which illustrates a semiconductor device according to an embodiment. The protection spacer LS may have a rectangular closed-loop shape, as shown in FIG. 15. Alternatively, the protection spacer LS may have a circular closed-loop shape, as shown in FIG. 16.

By way of summation and review, embodiments provide a semiconductor device with improved reliability, as well as a method of fabricating a semiconductor device with an increased production yield. That is, according to an embodiment, a semiconductor device may include a protection spacer, which prevents a bridge pattern from being formed between a gate electrode and a source/drain contact plug adjacent to each other and reduces a parasitic capacitance therebetween. Further, the method of fabricating a semiconductor device, according to an embodiment, may include forming the protection spacer, so process failure is reduced and production yield is increased. Accordingly, it may be possible to improve reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a gate pattern crossing over a substrate, the gate pattern including a gate insulating layer, a gate electrode, and a gate capping pattern sequentially stacked on the substrate;
a gate spacer covering a sidewall of the gate pattern;
a source/drain pattern on the substrate, the source/drain pattern being adjacent to the sidewall of the gate pattern;
a contact pad on the source/drain pattern, a top surface of the contact pad being lower than a top surface of the gate electrode, wherein the contact pad directly contacts the gate spacer and is disposed on a top surface of the source/drain pattern;
a source/drain contact plug on the contact pad; and
a protection spacer enclosing the source/drain contact plug between the gate spacer and the source/drain contact plug,
wherein, when viewed in a plan view, the protection spacer has a ring shape having an inner diameter and an outer diameter,
wherein the inner diameter of the protection spacer remains substantially constant as a distance from the substrate increases, and
wherein the outer diameter of the protective spacer changes along a lateral surface of the gate spacer as the distance from the substrate increases.

2. The device as claimed in claim 1, wherein the outer diameter of the protective spacer increases along the lateral surface of the gate spacer as the distance from the substrate increases.

3. The device as claimed in claim 1, wherein the outer diameter of the protective spacer remains substantially constant above a top surface of the gate spacer.

4. The device as claimed in claim 1, wherein the protection spacer has a dielectric constant lower than a dielectric constant of the gate spacer.

5. The device as claimed in claim 1, wherein a sidewall of the protection spacer is aligned with a sidewall of the contact pad.

6. The device as claimed in claim 1, wherein the protection spacer surrounds an entire outer sidewall of the source/drain contact plug.

7. The device as claimed in claim 1, wherein a width of the source/drain contact plug is smaller than a width of the contact pad.

8. The device as claimed in claim 1, further comprising:
a gate contact plug penetrating the gate capping pattern, the gate contact plug being in contact with the gate electrode and having a width smaller than a width of the gate capping pattern; and
an insulating pattern between the gate spacer and the protection spacer, and between the protection spacer and the gate contact plug, the insulating pattern including a material different from a material of the protection spacer.

9. The device as claimed in claim 1, further comprising a channel pattern, which includes a first semiconductor pattern and a second semiconductor pattern sequentially stacked on the substrate,
wherein the gate electrode covers top and side surfaces of the channel pattern and includes a first gate portion between the first semiconductor pattern and the second semiconductor pattern.

10. A semiconductor device, comprising:
a gate pattern crossing over a substrate, the gate pattern including a gate insulating layer, a gate electrode, and a gate capping pattern sequentially stacked on the substrate;
a gate spacer covering a sidewall of the gate pattern;
a source/drain pattern on the substrate, the source/drain pattern being adjacent to the sidewall of the gate pattern;
a contact pad on the source/drain pattern, a top surface of the contact pad being lower than a top surface of the gate electrode, wherein the contact pad directly contacts the gate spacer and is disposed on a top surface of the source/drain pattern;
a source/drain contact plug on the contact pad; and
a protection spacer enclosing the source/drain contact plug between the gate spacer and the source/drain contact plug,
wherein, when viewed in a plan view, the protection spacer has a ring shape having an inner diameter and an outer diameter, and wherein a difference between the inner diameter and the outer diameter of the protective spacer along a lateral surface of the gate spacer increases as a distance from the substrate increases.

11. The device as claimed in claim 10, wherein the difference between the inner and outer diameters of the protective spacer remains substantially constant above a top surface of the gate spacer.

12. The device as claimed in claim 10, wherein the protection spacer has a dielectric constant lower than a dielectric constant of the gate spacer.

13. The device as claimed in claim 10, wherein the protection spacer surrounds an entire outer sidewall of the source/drain contact plug.

14. The device as claimed in claim 10, further comprising:
a gate contact plug penetrating the gate capping pattern, the gate contact plug being in contact with the gate electrode and having a width smaller than a width of the gate capping pattern; and
an insulating pattern between the gate spacer and the protection spacer, and between the protection spacer and the gate contact plug, the insulating pattern including a material different from a material of the protection spacer.

15. A semiconductor device, comprising:
a gate pattern crossing over a substrate, the gate pattern including a gate insulating layer, a gate electrode, and a gate capping pattern sequentially stacked on the substrate;
a gate spacer covering a sidewall of the gate pattern;
a source/drain pattern on the substrate, the source/drain pattern being adjacent to the sidewall of the gate pattern;
a contact pad on the source/drain pattern, a top surface of the contact pad being lower than a top surface of the gate electrode, wherein the contact pad directly contacts the gate spacer and is disposed on a top surface of the source/drain pattern;
a source/drain contact plug on the contact pad; and
a protection spacer between the gate spacer and the source/drain contact plug,
wherein, when viewed in a plan view, the protection spacer has a ring shape enclosing the source/drain contact plug, and
wherein, when viewed in a cross-sectional view, a thickness of the protection spacer along a first direction increases along a lateral surface of the gate spacer as a distance from the substrate increases.

16. The device as claimed in claim 15, wherein the thickness of the protective spacer along the first direction remains substantially constant above a top surface of the gate spacer.

17. The device as claimed in claim 15, wherein the protection spacer has a dielectric constant lower than a dielectric constant of the gate spacer.

18. The device as claimed in claim 15, wherein the protection spacer surrounds an entire outer sidewall of the source/drain contact plug.

19. The device as claimed in claim 15, further comprising:
a gate contact plug penetrating the gate capping pattern, the gate contact plug being in contact with the gate electrode and having a width smaller than a width of the gate capping pattern; and
an insulating pattern between the gate spacer and the protection spacer, and between the protection spacer and the gate contact plug, the insulating pattern including a material different from a material of the protection spacer.

* * * * *